(12) United States Patent
Liu et al.

(10) Patent No.: US 12,310,182 B2
(45) Date of Patent: May 20, 2025

(54) DISPLAY SUBSTRATE AND DISPLAY DEVICE WITH SPACERS

(71) Applicant: BOE TECHNOLOGY GROUP CO., LTD., Beijing (CN)

(72) Inventors: Libin Liu, Beijing (CN); Jie Zhang, Beijing (CN); Hongli Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 800 days.

(21) Appl. No.: 16/957,607

(22) PCT Filed: Jul. 31, 2019

(86) PCT No.: PCT/CN2019/098705
§ 371 (c)(1),
(2) Date: Jun. 24, 2020

(87) PCT Pub. No.: WO2021/016945
PCT Pub. Date: Feb. 4, 2021

(65) Prior Publication Data
US 2022/0384539 A1 Dec. 1, 2022

(51) Int. Cl.
*H01L 27/32* (2006.01)
*H10K 59/122* (2023.01)
*H10K 59/35* (2023.01)

(52) U.S. Cl.
CPC ......... *H10K 59/122* (2023.02); *H10K 59/352* (2023.02)

(58) Field of Classification Search
CPC .................................................. H10K 59/122
See application file for complete search history.

(56) References Cited

U.S. PATENT DOCUMENTS

| 4,491,863 A | 1/1985 | Kurahashi |
| 4,652,912 A | 3/1987 | Masubuchi |
(Continued)

FOREIGN PATENT DOCUMENTS

| AU | 2018408152 A1 | 10/2019 |
| CN | 101192382 A | 6/2008 |
(Continued)

OTHER PUBLICATIONS

Extended European Search Report in European Application No. 19933238.8 dated Oct. 18, 2022.
(Continued)

*Primary Examiner* — Peter Bradford
(74) *Attorney, Agent, or Firm* — Collard & Roe, P.C.

(57) ABSTRACT

A display substrate and display device. The display substrate includes: a base substrate; a plurality of sub-pixel groups, arranged on the base substrate along a row direction and a column direction; and first spacers, second spacers, and third spacers, each of the plurality of sub-pixel groups includes a first sub-pixel, a second sub-pixel, and a third sub-pixel, in one row of sub-pixel groups, each of the first spacers is located between the first sub-pixel and the second sub-pixel which are adjacent to each other, each of the second spacers is located between the second sub-pixel and the third sub-pixel which are adjacent to each other, the third spacer is located between the third sub-pixel and the first sub-pixel which are adjacent to each other, and a number of the first spacers, a number of the second spacers, and a number of the third spacers are approximately equal.

12 Claims, 5 Drawing Sheets

(56) References Cited

U.S. PATENT DOCUMENTS

| | | |
|---|---|---|
| 5,113,274 A | 5/1992 | Takahashi et al. |
| 5,341,153 A | 8/1994 | Benzschawel et al. |
| 6,768,482 B2 | 7/2004 | Asano et al. |
| 6,950,115 B2 | 9/2005 | Brown Elliott |
| 7,123,277 B2 | 10/2006 | Brown Elliott et al. |
| 7,525,526 B2 | 4/2009 | Brown Elliott et al. |
| 7,663,299 B2 | 2/2010 | Chao et al. |
| 7,733,359 B1 | 6/2010 | Hagge et al. |
| 8,159,508 B2 | 4/2012 | Lee |
| 8,363,072 B2 | 1/2013 | Hong et al. |
| 8,446,435 B2 | 5/2013 | Tomizawa et al. |
| 8,754,913 B2 | 6/2014 | Hwang et al. |
| 8,994,015 B2 | 3/2015 | Pyon et al. |
| 9,337,241 B2 | 5/2016 | Lee et al. |
| 9,343,511 B1 | 5/2016 | Feng |
| 9,424,771 B2 | 8/2016 | Gong |
| 9,570,706 B2 | 2/2017 | Yim et al. |
| 9,647,039 B1 | 5/2017 | Wang et al. |
| 9,704,926 B2 | 7/2017 | Kim |
| 9,734,753 B2 | 8/2017 | Li et al. |
| 9,818,803 B2 | 11/2017 | Lee |
| 9,871,085 B2 | 1/2018 | Cho et al. |
| 9,905,604 B2 | 2/2018 | Murata |
| 9,946,123 B2 | 4/2018 | Huangfu et al. |
| 9,984,624 B2 | 5/2018 | Takahashi et al. |
| 10,181,499 B2 | 1/2019 | Jo et al. |
| 10,210,787 B2 | 2/2019 | Jin |
| 10,274,654 B2 | 4/2019 | Jin et al. |
| 10,283,086 B1 | 5/2019 | Su et al. |
| 10,373,541 B2 | 8/2019 | Lee et al. |
| 10,504,483 B2 | 12/2019 | Chen et al. |
| 10,565,918 B2 | 2/2020 | Wu et al. |
| 10,854,684 B2 | 12/2020 | Huangfu et al. |
| 10,861,905 B2 | 12/2020 | Wang |
| 10,867,545 B2 | 12/2020 | Kirisken |
| 10,909,901 B2 | 2/2021 | Wu et al. |
| 10,943,955 B2 | 3/2021 | Wang et al. |
| 10,991,768 B2 | 4/2021 | Li et al. |
| 11,069,286 B2 | 7/2021 | Tan et al. |
| 11,232,750 B2 | 1/2022 | Wang et al. |
| 11,233,096 B2 | 1/2022 | Huangfu et al. |
| 11,238,816 B2 | 2/2022 | Huangfu et al. |
| 11,264,430 B2 | 3/2022 | Huangfu et al. |
| 11,462,591 B2 | 10/2022 | Liu et al. |
| 2005/0018110 A1 | 1/2005 | Liu |
| 2005/0041188 A1 | 2/2005 | Yamazaki |
| 2007/0205423 A1 | 9/2007 | Yamazaki et al. |
| 2007/0290973 A1 | 12/2007 | Wei |
| 2008/0001525 A1 | 1/2008 | Chao et al. |
| 2008/0224968 A1 | 9/2008 | Kashiwabara |
| 2008/0231554 A1 | 9/2008 | Lee |
| 2009/0051638 A1 | 2/2009 | Horiuchi et al. |
| 2009/0079351 A1 | 3/2009 | Choi et al. |
| 2009/0121983 A1 | 5/2009 | Sung et al. |
| 2009/0128900 A1 | 5/2009 | Grasnick |
| 2009/0153044 A1* | 6/2009 | Yanagihara .......... H10K 59/131 |
| | | 313/504 |
| 2009/0302331 A1 | 12/2009 | Smith et al. |
| 2010/0033084 A1* | 2/2010 | Ko .................. H10K 50/11 |
| | | 445/24 |
| 2010/0289732 A1 | 11/2010 | Ina et al. |
| 2011/0025723 A1 | 2/2011 | Kim |
| 2011/0128262 A1 | 6/2011 | Chaji et al. |
| 2011/0234550 A1 | 9/2011 | Hong et al. |
| 2011/0260951 A1 | 10/2011 | Hwang et al. |
| 2011/0260952 A1 | 10/2011 | Hwang et al. |
| 2011/0291549 A1 | 12/2011 | Kim et al. |
| 2011/0291550 A1 | 12/2011 | Kim et al. |
| 2012/0025182 A1 | 2/2012 | Umeda et al. |
| 2012/0039034 A1 | 2/2012 | Jepsen et al. |
| 2012/0092238 A1 | 4/2012 | Hwang et al. |
| 2012/0313844 A1 | 12/2012 | Im et al. |
| 2013/0234917 A1 | 9/2013 | Lee |
| 2014/0003045 A1 | 1/2014 | Lee et al. |
| 2014/0071030 A1 | 3/2014 | Lee |
| 2014/0145586 A1 | 5/2014 | Choi |
| 2014/0198479 A1 | 7/2014 | Chao et al. |
| 2014/0220715 A1 | 8/2014 | Kang |
| 2014/0226323 A1 | 8/2014 | Huang et al. |
| 2014/0252321 A1 | 9/2014 | Pyon et al. |
| 2014/0284570 A1 | 9/2014 | Jinta et al. |
| 2014/0292622 A1 | 10/2014 | Lee |
| 2014/0346537 A1 | 11/2014 | Xi |
| 2015/0008820 A1 | 1/2015 | Lee |
| 2015/0015465 A1 | 1/2015 | Gong |
| 2015/0021637 A1 | 1/2015 | Ahn et al. |
| 2015/0062140 A1 | 3/2015 | Levantovsky et al. |
| 2015/0102320 A1 | 4/2015 | Jung |
| 2015/0162391 A1 | 6/2015 | Kim |
| 2015/0162394 A1 | 6/2015 | Tokuda et al. |
| 2015/0200237 A1 | 7/2015 | Yim et al. |
| 2015/0270317 A1 | 9/2015 | Lee et al. |
| 2015/0311264 A1 | 10/2015 | Shen et al. |
| 2015/0311265 A1 | 10/2015 | Matsueda et al. |
| 2015/0364525 A1 | 12/2015 | Lin et al. |
| 2015/0379916 A1 | 12/2015 | Guo et al. |
| 2016/0013251 A1 | 1/2016 | Yoshida et al. |
| 2016/0019825 A1 | 1/2016 | Guo et al. |
| 2016/0049438 A1 | 2/2016 | Murata |
| 2016/0078807 A1 | 3/2016 | Sun et al. |
| 2016/0104413 A1 | 4/2016 | Matsueda et al. |
| 2016/0126295 A1 | 5/2016 | Sato |
| 2016/0126296 A1 | 5/2016 | Feng |
| 2016/0126298 A1 | 5/2016 | Chen |
| 2016/0133181 A1 | 5/2016 | Nakamura |
| 2016/0155781 A1 | 6/2016 | Chaji |
| 2016/0171918 A1 | 6/2016 | Kim et al. |
| 2016/0190523 A1 | 6/2016 | Kim et al. |
| 2016/0196776 A1 | 7/2016 | Yang et al. |
| 2016/0203748 A1 | 7/2016 | Matsueda et al. |
| 2016/0240593 A1 | 8/2016 | Gu et al. |
| 2016/0253943 A1 | 9/2016 | Wang |
| 2016/0254476 A1 | 9/2016 | Park |
| 2016/0293678 A1 | 10/2016 | Wang |
| 2016/0300892 A1 | 10/2016 | Bai et al. |
| 2016/0343284 A1 | 11/2016 | Sun |
| 2016/0351119 A1 | 12/2016 | Ono |
| 2016/0357076 A1 | 12/2016 | Huangfu et al. |
| 2016/0358536 A1 | 12/2016 | Li et al. |
| 2016/0358985 A1 | 12/2016 | Bai et al. |
| 2016/0370919 A1 | 12/2016 | Xu et al. |
| 2017/0039924 A1 | 2/2017 | Jin |
| 2017/0133440 A1 | 5/2017 | Wang et al. |
| 2017/0179389 A1 | 6/2017 | Cho et al. |
| 2017/0193880 A1 | 7/2017 | Lee et al. |
| 2017/0194399 A1* | 7/2017 | Cho .................. H10K 59/123 |
| 2017/0294491 A1 | 10/2017 | Jo et al. |
| 2017/0317150 A1 | 11/2017 | Chung et al. |
| 2017/0352710 A1 | 12/2017 | Hong et al. |
| 2018/0012547 A1 | 1/2018 | Li et al. |
| 2018/0088260 A1 | 3/2018 | Jin et al. |
| 2018/0090549 A1 | 3/2018 | Hamada et al. |
| 2018/0097043 A1 | 4/2018 | Song |
| 2018/0175121 A1 | 6/2018 | Ji et al. |
| 2018/0182828 A1 | 6/2018 | Kim |
| 2018/0247984 A1 | 8/2018 | Wang et al. |
| 2018/0292695 A1 | 10/2018 | You et al. |
| 2018/0308412 A1 | 10/2018 | Wu et al. |
| 2018/0308907 A1 | 10/2018 | Jin et al. |
| 2018/0342570 A1 | 11/2018 | Hong et al. |
| 2018/0355466 A1 | 12/2018 | Mu |
| 2019/0004648 A1 | 1/2019 | Xu et al. |
| 2019/0011830 A1 | 1/2019 | Ji |
| 2019/0035859 A1 | 1/2019 | Kang et al. |
| 2019/0066564 A1 | 2/2019 | Tan |
| 2019/0088726 A1 | 3/2019 | Zhang |
| 2019/0096962 A1 | 3/2019 | Han et al. |
| 2019/0103058 A1 | 4/2019 | Ma et al. |
| 2019/0115399 A1 | 4/2019 | Jo et al. |
| 2019/0131589 A1 | 5/2019 | Matsueda et al. |
| 2019/0139513 A1 | 5/2019 | Su et al. |
| 2019/0140030 A1 | 5/2019 | Huangfu et al. |
| 2019/0173042 A1* | 6/2019 | Lim .................. H10K 59/353 |
| 2019/0206341 A1 | 7/2019 | Liao et al. |

(56) References Cited

U.S. PATENT DOCUMENTS

| | | | |
|---|---|---|---|
| 2019/0237518 A1 | 8/2019 | Sun et al. | |
| 2019/0296093 A1* | 9/2019 | Liu | H10K 59/353 |
| 2019/0319076 A1* | 10/2019 | Lee | H10K 50/844 |
| 2019/0326365 A1 | 10/2019 | Jin | |
| 2019/0340970 A1 | 11/2019 | Kirisken | |
| 2020/0013833 A1 | 1/2020 | Wang et al. | |
| 2020/0035172 A1 | 1/2020 | Chen | |
| 2020/0043990 A1 | 2/2020 | Huangfu et al. | |
| 2020/0051485 A1 | 2/2020 | Liu et al. | |
| 2020/0058713 A1 | 2/2020 | Zhang | |
| 2020/0119107 A1 | 4/2020 | Liu et al. | |
| 2020/0258441 A1 | 8/2020 | Zhang et al. | |
| 2020/0328259 A1 | 10/2020 | Joe | |
| 2020/0357862 A1 | 11/2020 | Wang et al. | |
| 2020/0365085 A1 | 11/2020 | Yang et al. | |
| 2021/0091145 A1 | 3/2021 | Huangfu et al. | |
| 2021/0335297 A1 | 10/2021 | Huangfu et al. | |
| 2022/0028348 A1 | 1/2022 | Huangfu et al. | |

FOREIGN PATENT DOCUMENTS

| | | | |
|---|---|---|---|
| CN | 101582241 A | 11/2009 | |
| CN | 101339729 B | 6/2010 | |
| CN | 102201430 A | 9/2011 | |
| CN | 101582241 B | 10/2011 | |
| CN | 103681754 A | 3/2014 | |
| CN | 103777393 A | 5/2014 | |
| CN | 104037202 A | 9/2014 | |
| CN | 104051493 A | 9/2014 | |
| CN | 104269411 A | 1/2015 | |
| CN | 104282727 A | 1/2015 | |
| CN | 104332486 A | 2/2015 | |
| CN | 104362170 A | 2/2015 | |
| CN | 104377229 A | 2/2015 | |
| CN | 104465714 A | 3/2015 | |
| CN | 104576695 A | 4/2015 | |
| CN | 104597655 A | 5/2015 | |
| CN | 104637987 A | 5/2015 | |
| CN | 104701341 A | 6/2015 | |
| CN | 104795431 A | 7/2015 | |
| CN | 104835832 A | 8/2015 | |
| CN | 104882464 A | 9/2015 | |
| CN | 105280139 A | 1/2016 | |
| CN | 204991022 U | 1/2016 | |
| CN | 204991023 U | 1/2016 | |
| CN | 205231065 U | 5/2016 | |
| CN | 205355055 U | 6/2016 | |
| CN | 105741774 A | 7/2016 | |
| CN | 105789253 A | 7/2016 | |
| CN | 105826349 A | 8/2016 | |
| CN | 105976757 A | 9/2016 | |
| CN | 205608350 U | 9/2016 | |
| CN | 106094334 A | 11/2016 | |
| CN | 205845956 U | 12/2016 | |
| CN | 106293244 A | 1/2017 | |
| CN | 106298865 A | 1/2017 | |
| CN | 106601167 A | 4/2017 | |
| CN | 106782307 A | 5/2017 | |
| CN | 206163494 U | 5/2017 | |
| CN | 104597655 B | 6/2017 | |
| CN | 106935618 A | 7/2017 | |
| CN | 106935630 A | 7/2017 | |
| CN | 106991957 A | 7/2017 | |
| CN | 107248378 A | 10/2017 | |
| CN | 107256695 A | 10/2017 | |
| CN | 107275359 A | 10/2017 | |
| CN | 107393468 A | 11/2017 | |
| CN | 107481671 A | 12/2017 | |
| CN | 107644888 A | 1/2018 | |
| CN | 107665684 A | 2/2018 | |
| CN | 107817632 A | 3/2018 | |
| CN | 107910348 A | 4/2018 | |
| CN | 108258013 A | 7/2018 | |
| CN | 207781607 U | 8/2018 | |
| CN | 207781608 U | 8/2018 | |
| CN | 108493221 A | 9/2018 | |
| CN | 207883217 U | 9/2018 | |
| CN | 208172438 U | 11/2018 | |
| CN | 208172439 U | 11/2018 | |
| CN | 109491158 A | 3/2019 | |
| CN | 109559679 A | 4/2019 | |
| CN | 109891487 A | 6/2019 | |
| CN | 110010021 A | 7/2019 | |
| EP | 2 423 911 A2 | 2/2012 | |
| EP | 2 680 310 A1 | 1/2014 | |
| EP | 3 306 598 A1 | 4/2018 | |
| EP | 3751611 A1 | 12/2020 | |
| JP | H0945266 A * | 2/1997 | |
| JP | 2002-221917 A | 8/2002 | |
| JP | 2005062416 A | 3/2005 | |
| JP | 2008-015521 A | 1/2008 | |
| JP | 2008225179 A | 9/2008 | |
| JP | 2009533810 A | 9/2009 | |
| JP | 2010-212814 A | 9/2010 | |
| JP | 2014056819 A | 3/2014 | |
| JP | 2014-203004 A | 10/2014 | |
| JP | 2014225329 A | 12/2014 | |
| JP | 2015138955 A | 7/2015 | |
| JP | 2016-090991 A | 5/2016 | |
| JP | 2016075868 A | 5/2016 | |
| JP | 2016091918 A | 5/2016 | |
| JP | 2016130780 A | 7/2016 | |
| JP | 2016537688 A | 12/2016 | |
| JP | 2018503849 A | 2/2018 | |
| JP | 2018198198 A | 12/2018 | |
| KR | 10-2009-0049515 A | 5/2009 | |
| KR | 10-2011-0108050 A | 10/2011 | |
| KR | 10-1347995 B1 | 1/2014 | |
| KR | 10-2015-0006668 A | 1/2015 | |
| KR | 10-2016-0051511 A | 5/2016 | |
| KR | 10-2017-0116556 A | 10/2017 | |
| RU | 2 453 879 C2 | 6/2012 | |
| RU | 2 721 902 C1 | 5/2020 | |
| WO | 2007/088656 A1 | 8/2007 | |
| WO | 2014/136149 A1 | 9/2014 | |
| WO | 2016/192241 A1 | 12/2016 | |
| WO | 2017/140038 A1 | 8/2017 | |
| WO | 2018/014562 A1 | 1/2018 | |
| WO | 2019084932 A1 | 5/2019 | |
| WO | 2019134514 A1 | 7/2019 | |
| WO | 2019134522 A1 | 7/2019 | |
| WO | 2019/153948 A1 | 8/2019 | |
| WO | 2019153949 A1 | 8/2019 | |
| WO | 2020124693 A1 | 6/2020 | |

OTHER PUBLICATIONS

Extended European Search Report in European Application No. 19832268.7 dated Oct. 25, 2022.
Japanese Office Action in Japanese Application No. 2020-536078 dated Nov. 28, 2022.
Japanese Office Action in Japanese Application No. 2019-549456 dated Nov. 29, 2022.
Japanese Office Action in Japanese Application No. 2019-543028 dated Nov. 29, 2022.
Japanese Office Action in Japanese Application No. 2020535989 dated Jan. 4, 2023.
Korean Office Action in Korean Application No. 2021-7030323 dated Jan. 25, 2022 with English translation.
U.S. Office Action in U.S. Appl. No. 16/621,904 dated Mar. 15, 2022.
European Office Action in European Application No. 18903035.6 dated Nov. 16, 2023.
Chinese Office Action in Chinese Application No. 201810137012.7 in Nov. 30, 2023 with English translation.
Chinese Office Action in Chinese Application No. 201810136335.4 in Nov. 15, 2023 in English translation.
Chinese Office Action in Chinese Application No. 201810137016.5 dated Nov. 30, 2023 in English translation.
U.S. Office Action in U.S. Appl. No. 17/551,341 dated Sep. 27, 2023.

(56) References Cited

OTHER PUBLICATIONS

International Search Report of PCT/CN2019/086875 in Chinese, mailed Sep. 25, 2019, with English translation.
Notice of Transmittal of the International Search Report of PCT/CN2019/086875 in Chinese, mailed Sep. 25, 2019.
Written Opinion of the International Searching Authority of PCT/CN2019/086875 in Chinese, mailed Sep. 25, 2019.
International Search Report of PCT/CN2019/098705 in Chinese, mailed May 6, 2020, with English translation.
Notice of Transmittal of the International Search Report of PCT/CN2019/098705 in Chinese, mailed May 6, 2020.
Written Opinion of the International Searching Authority of PCT/CN2019/098705 in Chinese, mailed May 6, 2020, with English translation.
International Search Report of PCT/CN2019/098707 in Chinese, mailed May 9, 2020, with English translation.
Notice of Transmittal of the International Search Report of PCT/CN2019/098707 in Chinese, mailed May 9, 2020.
Written Opinion of the International Searching Authority of PCT/CN2019/098707 in Chinese, mailed May 9, 2020, with English translation.
International Search Report of PCT/CN2019/097765, mailed Oct. 28, 2019.
Written Opinion of the International Searching Authority of PCT/CN2019/097765, mailed Oct. 28, 2019.
Extended European Search Report in European Application No. 19933217.2 dated Jul. 5, 2022.
Notice of Allowance in U.S. Appl. No. 16/630,496 dated Mar. 26, 2021.
Notice of Allowance in U.S. Appl. No. 16/600,316 dated Apr. 14, 2021.
Extended European Search Report in European Patent Application EP 21152119.0 dated May 11, 2021.
Indian Office Action in Indian Application No. 202017026082 dated May 25, 2021.
Park et al., Luminance Uniformity of Large-Area OLEDs With an Auxiliary Metal Electrode, Journal of Display Technology, Aug. 2009, pp. 307-311, vol. 5, No. 8.
U.S. Non-Final Office Action in U.S. Appl. No. 16/621,904 dated Aug. 2, 2021.
Indian Office Action in Indian Application No. 202017027785 dated Aug. 19, 2021 with English translation.
Korean Written Decision of Dismissal of Amendment in Korean Application No. 10-2019-7027773 dated Aug. 24, 2021 with English translation.
U.S. Non-Final Office Action in U.S. Appl. No. 16/483,210 dated Sep. 22, 2021.
European Extended Search Report in European Patent Application No. 18905693.0 dated Oct. 1, 2021.
Extended European Search Report in European Application No. 18905189.9 dated Oct. 19, 2021.
Extended European Search Report in European Application No. 18903035.6 dated Nov. 8, 2021.
Indian Office Action in Indian Application No. 202027048001 dated Dec. 6, 2021 with English translation.
U.S. Office Action in U.S. Appl. No. 16/622,045 dated Dec. 21, 2021.
Korean Office Action in Korean Application No. 10-2019-7027773, mailed Dec. 25, 2020 with English translation.
First Chinese Office Action in Chinese Application No. 201680082630.5 dated Apr. 1, 2022 with English translation.
U.S. Notice of Allowance in U.S. Appl. No. 16/755,970 dated May 6, 2022.
U.S. Office Action in U.S. Appl. No. 17/497,630 dated May 12, 2022.
First Australian Office Action in Australian Application No. 2021203983 dated May 12, 2022.
Candice H. Brown Elliot, "Reducing Pixel Count Without Reducing Image Quality", Information display, vol. 1999 (12):22-25, 1999 (4 pages).
Lu Fang et al., "Subpixel Rendering: From Font Rendering to Image Subsampling", IEEE Signal Processing Magazine, vol. 2013 (5): 177~182 and 189, 2013 (7 pages).
Dean S. Messing, Scott Daly, "Improved Display Resolution of Subsampled Colour Images Using Subpixel Addressing", IEEE ICIP 2002: 1-625~628, 2002 (4 pages).
Huang et al., "RGB to RGBG conversion algorithm based on weighting factors and related FPGA realization", China Academic Journal Electronic Publishing House, vol. 32, No. 7, Jul. 2017, pp. 572-579 (8 pages).
International Search Report of PCT/CN2018/124890 in Chinese, mailed Mar. 27, 2019, with English translation.
International Preliminary Report on Patentability of PCT/CN2018/124890, issuance date Aug. 11, 2020 and English Translation of the Written Opinion of the International Searching Authority of PCT/CN2018/124890, mailed Mar. 27, 2019.
International Search Report of PCT/CN2018/124881 in Chinese, mailed Mar. 26, 2019, with English translation.
International Preliminary Report on Patentability of PCT/CN2018/124881, issuance date Aug. 11, 2020 and English Translation of the Written Opinion of the International Searching Authority of PCT/CN2018/124881, mailed Mar. 26, 2019.
International Search Report of PCT/CN2018/124884 in Chinese, mailed Mar. 27, 2019, with English translation.
International Preliminary Report on Patentability of PCT/CN2018/124884, issuance date Aug. 11, 2020 and English Translation of the Written Opinion of the International Searching Authority of PCT/CN2018/124884, mailed Mar. 27, 2019.
International Search Report of PCT/CN2018/124445 in Chinese, mailed Mar. 21, 2019, with English translation.
International Preliminary Report on Patentability of PCT/CN2018/124445, issuance date Aug. 11, 2020 and English Translation of the Written Opinion of the International Searching Authority of PCT/CN2018/124445, mailed Mar. 19, 2019.
International Search Report of PCT/CN2018/124404 in Chinese, mailed Mar. 14, 2019, with English translation.
International Preliminary Report on Patentability of PCT/CN2018/124404, issuance date Aug. 11, 2020 and English Translation of the Written Opinion of the International Searching Authority of PCT/CN2018/124404, mailed Mar. 14, 2019.
International Search Report of PCT/CN2016/081097 in Chinese, mailed Nov. 16, 2016, with English translation.
International Preliminary Report on Patentability of PCT/CN2016/081097, issuance date Aug. 21, 2018 and English Translation of the Written Opinion of the International Searching Authority of PCT/CN2016/081097, mailed Nov. 16, 2016.
First Office Action in U.S. Appl. No. 15/536,347 dated Aug. 28, 2018.
International Search Report of PCT/CN2017/075957 in Chinese, mailed Jun. 8, 2017.
International Preliminary Report on Patentability of PCT/CN2017/075957, issuance date Jan. 22, 2019 and Written Opinion of the International Searching Authority of PCT/CN2017/075957, mailed Jun. 8, 2017.
Indian Office Action in Indian Application No. 201717038562, mailed Oct. 15, 2019.
First Office Action in U.S. Appl. No. 15/578,481 dated Feb. 1, 2019.
Non-Final Office Action in U.S. Appl. No. 15/578,481 dated Jul. 11, 2019.
English translation of Extended European Search Report in EP Application No. 17768339.8 mailed Dec. 6, 2019.
Korean Office Action in Korean Application No. 10-2017-7022698, mailed May 29, 2019 with English translation.
Korean Notice of Allowance in Korean Application No. 10-2017-7022698, mailed Mar. 6, 2020.
Chinese Office Action in Chinese Application No. 201810135947.1, mailed Mar. 3, 2020 with English translation.
Russian Notice of Allowance in Russian Application No. 2019130488, mailed Mar. 18, 2020 with English Translation.
First Office Action in U.S. Appl. No. 16/492,930 dated Jul. 24, 2020.
Korean Office Action in Korean Application No. 10-2019-7024785, mailed Jul. 30, 2020 with English translation.

(56) References Cited

OTHER PUBLICATIONS

Notice of Allowance in U.S. Appl. No. 16/234,777 dated Sep. 1, 2020.
First Office Action in U.S. Appl. No. 16/621,918 dated Sep. 29, 2020.
First Office Action in U.S. Appl. No. 16/600,316 dated Oct. 6, 2020.
Japanese Office Action in Japanese Application No. 2017-544608, mailed Oct. 12, 2020 with English translation.
U.S. Notice of Allowance in U.S. Appl. No. 17/881,874 dated Mar. 31, 2023.
U.S. Office Action in U.S. Appl. No. 17/551,341 dated Apr. 26, 2023.
U.S. Office Action in U.S. Appl. No. 16/621,904 dated Feb. 10, 2023.
Japanese Office Action in Japanese Patent Application No. 2019-569438 dated Mar. 27, 2023.
Japanese Office Action in Japanese Patent Application No. 2023-158357 dated Aug. 5, 2024 with English translation.
Japanese First Office Action in Japanese Application No. 2023-215865 dated Nov. 25, 2024.

\* cited by examiner

DISPLAY SUBSTRATE AND DISPLAY DEVICE WITH SPACERS

CROSS REFERENCE TO RELATED APPLICATIONS

This application is the National Stage of PCT/CN2019/098705 filed on Jul. 31, 2019, the disclosure of which is incorporated by reference.

TECHNICAL FIELD

Embodiments of the present disclosure relates to a display substrate and a display device.

BACKGROUND

With the continuous development of display technology, organic light emitting diode (OLED) display panel has been increasingly applied to various electronic devices due to its advantages of self-luminescence, wide viewing angle, high contrast, low power consumption, high reaction speed, etc.

SUMMARY

At least one embodiment of the present disclosure provides a display substrate, including: a base substrate; a plurality of sub-pixel groups, arranged on the base substrate along a row direction and a column direction; and first spacers, second spacers, and third spacers, each of the plurality of sub-pixel groups includes a first sub-pixel, a second sub-pixel, and a third sub-pixel, in one row of sub-pixel groups, each of the first spacers is located between the first sub-pixel and the second sub-pixel which are adjacent to each other, each of the second spacers is located between the second sub-pixel and the third sub-pixel which are adjacent to each other, the third spacer is located between the third sub-pixel and the first sub-pixel which are adjacent to each other, and a number of the first spacers, a number of the second spacers, and a number of the third spacers are approximately equal to one another.

For example, in the display substrate provided by an embodiment of the present disclosure, in one row of sub-pixel groups, the first spacers, the second spacers, and the third spacers are subsequently and repeatedly arranged.

For example, in the display substrate provided by an embodiment of the present disclosure, each of the plurality of sub-pixel groups includes at most one first spacer, one second spacer, or one third spacer.

For example, in the display substrate provided by an embodiment of the present disclosure, each of the plurality of sub-pixel groups includes one first sub-pixel, one second sub-pixel, and one third sub-pixel pair, the third sub-pixel pair includes two third sub-pixels, in one row of sub-pixel groups, each of the first spacers is located between the first sub-pixel and the second sub-pixel which are adjacent to each other, each of the second spacers is located between the second sub-pixel and the third sub-pixel pair which are adjacent to each other, and each of the third spacers is located between the third sub-pixel pair and the first sub-pixel which are adjacent to each other.

For example, in the display substrate provided by an embodiment of the present disclosure, in each of the plurality of sub-pixel groups, the first sub-pixel, the second sub-pixel, and the third sub-pixel pair are arranged along the row direction and form three sub-pixel columns, and the two third sub-pixels in the third sub-pixel pair are arranged along the column direction.

For example, in the display substrate provided by an embodiment of the present disclosure, in one row of sub-pixel groups, one of the first spacers and one of the second spacers are separated by 1+3n sub-pixel columns, one of the second spacers and one of the third spacers are separated by 1+3n sub-pixel columns, and one of the third spacers and one of the first spacers are separated by 1+3n sub-pixel columns, n is a positive integer greater than or equal to 1.

For example, in the display substrate provided by an embodiment of the present disclosure, two adjacent rows of the plurality of sub-pixel groups are offset by ½ pitch, and the pitch is a distance between centers of the two first sub-pixels of two adjacent ones of the plurality of sub-pixel groups in the row direction.

For example, in the display substrate provided by an embodiment of the present disclosure, the first sub-pixel is configured to emit light of a first color, the second sub-pixel is configured to emit light of a second color, and the third sub-pixel is configured to emit light of a third color.

For example, in the display substrate provided by an embodiment of the present disclosure, the first color is blue, the second color is red, and the third color is green.

For example, in the display substrate provided by an embodiment of the present disclosure, each of the first spacers has a substantially elongated shape, an extending direction of each of the first spacers is substantially parallel to the column direction, each of the second spacers has a substantially elongated shape, an extending direction of each of the second spacers is substantially parallel to the column direction, each of the third spacers has a substantially elongated shape, and an extending direction of each of the third spacers is substantially parallel to the column direction.

For example, in the display substrate provided by an embodiment of the present disclosure, a size of each of the first spacers in the column direction is smaller than a size of the first sub-pixel in the column direction, a size of each of the second spacers and a size of each of the third spacers in the column direction are both smaller than a size of the third sub-pixel pair in the column direction, a center of each of the first spacers, a center of each of the second spacers, a center of each of the third spacers, a center of the first sub-pixel, a center of the second sub-pixel, and a center of the third sub-pixel pair are located on a straight line substantially parallel to the row direction.

For example, in the display substrate provided by an embodiment of the present disclosure, each of the first spacers, each of the second spacers, and each of the third spacers have the same size, a width of each of the first spacers in the row direction has a range of 6-15 microns, a length of each of the first spacers in the column direction has a range of 35-45 microns, and a height of each of the first spacers in a direction perpendicular to the base substrate has a range of 1.5-2.5 microns.

For example, in the display substrate provided by an embodiment of the present disclosure, the first sub-pixel includes a first anode and a first light emitting functional layer, the second sub-pixel includes a second anode and a second light emitting functional layer, the third sub-pixel includes a third anode and a third light emitting functional layer, and the display substrate further includes: a pixel defining layer, located on a side of the first anode, the second anode, and the third anode away from the base substrate, and including a first opening, a second opening, and a third opening, the first opening exposing the first anode, the second opening exposing the second anode, and the third opening exposing the third anode, at least a part of the first light-emitting functional layer is located in the first opening and covers an exposed portion of the first anode, at least a part of the second light-emitting functional layer is located in the second opening and covers an exposed portion of the second anode, at least a part of the third light-emitting functional layer is located in the third opening and covers an exposed portion of the third anode, and the first spacers, the second spacers, and the third spacers are located on a surface of the pixel defining layer away from the base substrate.

For example, in the display substrate provided by an embodiment of the present disclosure, orthographic projections of the first spacers, the second spacers, and the third spacers on the base substrate are not overlapped with orthographic projections of the first opening, the second opening, and the third opening on the base substrate.

For example, in the display substrate provided by an embodiment of the present disclosure, the first spacers, the second spacers, and the third spacers are formed by one mask process.

At least one embodiment of the present disclosure provides a display device, including any one of the abovementioned display substrates.

At least one embodiment of the present disclosure provides a display substrate including: a base substrate; a plurality of sub-pixel groups, arranged on the base substrate along a row direction and a column direction; each of the plurality of sub-pixel groups includes a first sub-pixel, a second sub-pixel, and a third sub-pixel pair, the third sub-pixel pair includes two third sub-pixels, the first sub-pixel includes a first anode and a first pixel driving circuit, the second sub-pixel includes a second anode and a second pixel driving circuit, each of the third sub-pixels includes a third anode and a third pixel driving circuit, and the display substrate further includes a first planarization layer, located between the first anode and the first pixel drive circuit, between the second anode and the second pixel drive circuit, and between the third anode and the third pixel drive circuit, the first sub-pixel includes a first via hole located in the first planarization layer, the second sub-pixel includes a second via hole located in the first planarization layer, the third sub-pixel includes a third via hole located in the first planarization layer, the first via hole is configured for connecting the first anode and the first pixel drive circuit, the second via hole is configured for connecting the second anode and the second pixel drive circuit, the third via hole is configured for connecting the third anode and the third pixel drive circuit, the first via holes, the second via holes, and a part of the third via holes in one row of sub-pixel groups are located substantially on a first straight line.

For example, in the display substrate provided by an embodiment of the present disclosure, the first straight line is substantially parallel to the row direction.

For example, in the display substrate provided by an embodiment of the present disclosure, in each of the plurality of sub-pixel groups, the first sub-pixel, the second sub-pixel and the third sub-pixel pair are arranged along the row direction, the two third sub-pixels in the third sub-pixel pair are arranged along the column direction, two third via holes of the two third sub-pixels in the third sub-pixel pair are respectively located on two adjacent first straight lines.

For example, in the display substrate provided by an embodiment of the present disclosure, the display substrate further including: a second planarization layer, located between the first planarization layer and the first pixel drive circuit, the second pixel drive circuit, and the third pixel drive circuit; a first connection electrode, a second connection electrode, and a third connection electrode, located between the second planarization layer and the first planarization layer, the first pixel driving circuit includes a first electrode, the second pixel driving circuit includes a second electrode, the third pixel driving circuit includes a third electrode, the first sub-pixel includes a fourth via hole located in the second planarization layer, the second sub-pixel includes a fifth via hole located in the second planarization layer, the third sub-pixel includes a sixth via hole located in the second planarization layer, the fourth via hole is configured for connecting the first electrode and the first connection electrode, the fifth via hole is configured for connecting the second electrode and the second connection electrode, the sixth via hole is configured for connecting the third electrode and the third connection electrode, the fourth via holes, the fifth via holes, and a part of the sixth via holes in one row of sub-pixel groups are located substantially on a second straight line.

For example, in the display substrate provided by an embodiment of the present disclosure, two sixth via holes of the two third sub-pixels in the third sub-pixel pair are respectively located on two adjacent second straight lines.

For example, in the display substrate provided by an embodiment of the present disclosure, in one row of sub-pixel groups, the first straight line and the second straight line substantially coincide.

For example, in the display substrate provided by an embodiment of the present disclosure, the fourth via hole, the first via hole, the sixth via hole, the third via hole, the fifth via hole, the second via hole, the sixth via hole, and the third via hole in one row of sub-pixel groups are subsequently and repeatedly arranged.

For example, in the display substrate provided by an embodiment of the present disclosure, the first via hole, the second via hole, the third via hole, the fourth via hole, the fifth via hole, and the sixth via hole are spaced apart from each other.

For example, in the display substrate provided by an embodiment of the present disclosure, the first via hole, the second via hole, and the third via hole are arranged at equal intervals.

For example, in the display substrate provided by an embodiment of the present disclosure, the fourth via hole, the fifth via hole, and the sixth via hole are arranged at equal intervals.

For example, in the display substrate provided by an embodiment of the present disclosure, a distance between the first via hole and the fourth via hole is smaller than a distance between the first via hole and the second via hole, a distance between the second via hole and the fifth via hole is smaller than a distance between the second via hole and the third via hole, and a distance between the third via hole and the sixth via hole is smaller than a distance between the second via hole and the third via hole.

For example, in the display substrate provided by an embodiment of the present disclosure, the first straight line is located between two adjacent rows of the plurality of sub-pixel groups.

At least one embodiment of the present disclosure provides a display device, including any one of the abovementioned display substrates.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
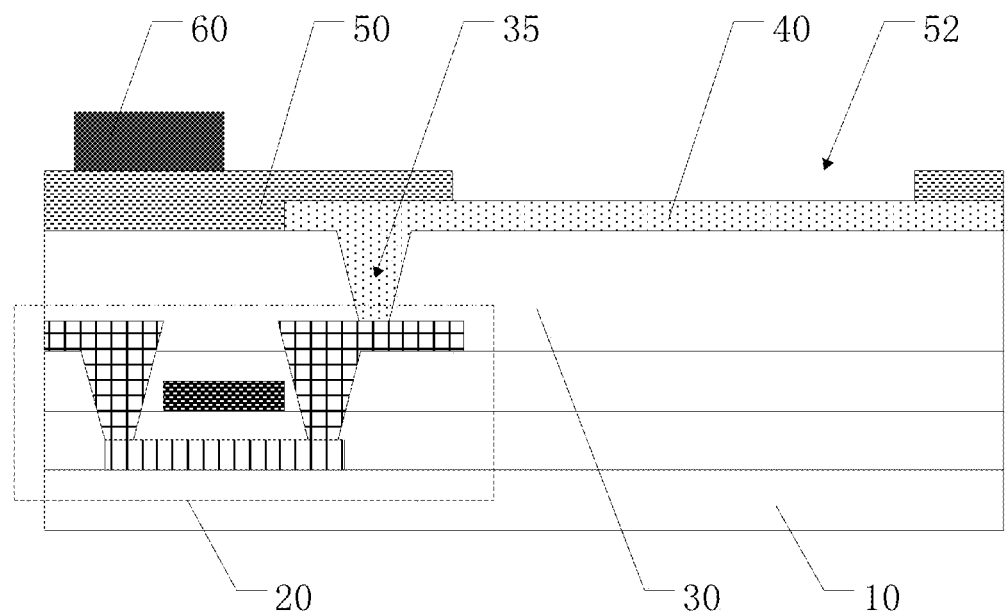
FIG. 1 is a schematic structural diagram of an OLED display substrate.

FIG. 1 is a schematic structural diagram of an OLED display substrate. As illustrated by FIG. 1, the OLED display substrate includes a base substrate 10, a pixel driving circuit 20, a planarization layer 30, an anode 40, a pixel defining layer 50, and a spacer (PS) 60. The pixel driving circuit 20 is disposed on the base substrate 10; the planarization layer 30 is disposed on a side of the pixel driving circuit 20 away from the base substrate 10; the anode 40 is disposed on a side of the planarization layer 30 away from the substrate 10, and can be electrically connected to the pixel driving circuit 20 through a via hole 35 in the planarization layer 30. The pixel defining layer 50 is disposed on a side of the anode 40 away from the base substrate 10 and is provided with an opening 52 that can expose the anode 40; the spacer 60 is disposed on a side of the pixel defining layer 50 away from the base substrate 10. An orthographic projection of the spacer 60 on the base substrate 10 and an orthographic projection of the opening 52 on the base substrate 10 are not overlapped with each other.

As illustrated by FIG. 1, the opening 52 may be provided with a light-emitting layer (not shown in the figure), the light-emitting layer is arranged in contact with the anode 50, a cathode (not shown in the figure) may also be arranged on a side of the light-emitting layer away from the anode 50, and the light-emitting layer may emit light under the action of current between the anode and the cathode. In general, area of the anode 50 is slightly larger than area of the opening 52, so that the opening 52 may define an effective light emitting region of a sub-pixel. The spacer 60 is generally disposed at the periphery of the sub-pixel, and can function as a support for a fine metal mask (FMM) upon the light emitting layer being evaporated. However, the following problems exist in the common arrangement of spacers: upon arrangement density of the spacers being high, the FMM placed on the spacers may scratch the spacers, thus causing scratched parts to fall off from the spacers to form particles, which will directly bring particle risks and reduce product yield. On the other hand, upon being provided at a first lateral side of a sub-pixel, the spacer will limit a light emitting angle of the sub-pixel at the first lateral side, while the second lateral side (the second lateral side is opposite to the first lateral side) of the spacer not provided by the sub-pixel will not limit the light emitting angle of the sub-pixel at the second lateral side, in this away, upon the sub-pixel being observed from the first lateral side and the second lateral side at the same angle with respect to the normal of the display substrate, the brightness of the sub-pixel observed from the first lateral side is different from the brightness of the sub-pixel observed from the second lateral side, resulting in color shift at different viewing angles, i.e., the color observed from the first lateral side is different from the color observed from the second lateral side. In addition, because the spacers are distributed differently around the sub-pixels of different colors, the sub-pixels of different colors are affected differently by the spacers, thus further causing the display substrate to generate color shift when viewing pictures under different viewing angles.

Figure 2A:
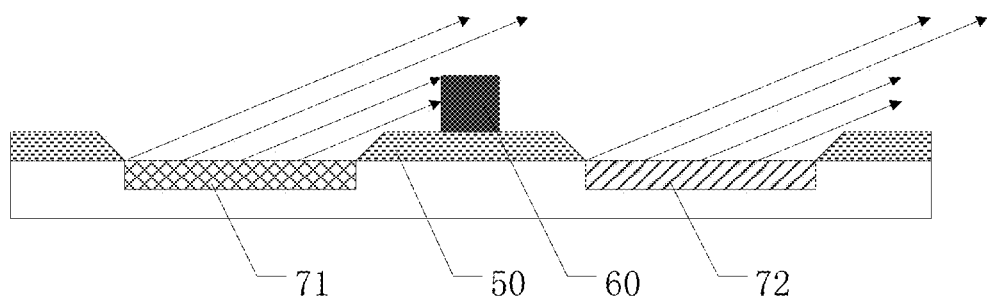
FIG. 2A is a schematic diagram showing a light emitting situation of sub-pixels in a display substrate.
Figure 2B:
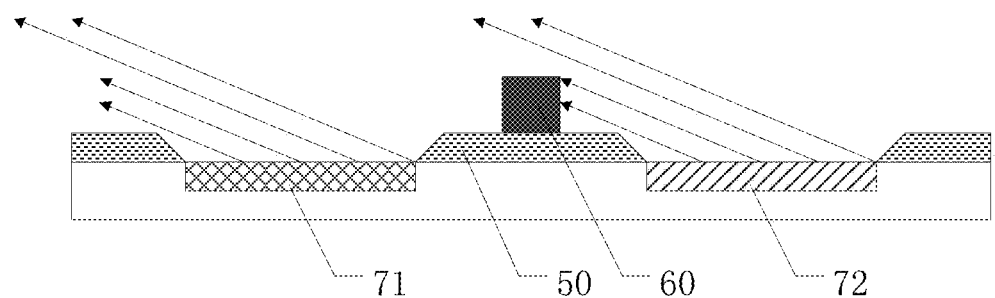
FIG. 2B is a schematic diagram showing a light emitting situation of sub-pixels in another display substrate.

FIG. 2A is a schematic diagram showing a light emitting situation of sub-pixels in a display substrate. FIG. 2B is a schematic diagram showing a light emitting situation of sub-pixels in another display substrate. FIGS. 2A and 2B show a blue sub-pixel 71, a red sub-pixel 72, a pixel defining layer 50, and a spacer 60 located between the blue sub-pixel 71 and the red sub-pixel 72. As illustrated by FIGS. 2A and 2B, due to the shielding effect of the spacer 60, light emitted by the blue sub-pixel 71 toward the first lateral side (e.g., the left side in FIG. 2A) will be shielded by the pixel defining layer 50, while the light emitted by the blue sub-pixel 71 toward the second lateral side (e.g., the right side in FIG. 2A) will be shielded by the pixel defining layer 50 and the spacer 60. The spacer 60 is disposed on the pixel defining layer 50, so that the light emitted from the blue sub-pixel 71 toward the second lateral side is blocked to a greater extent. On the one hand, the brightness of the light emitted from the blue sub-pixel 71 toward the second lateral side is less than the brightness of the light emitted from the blue sub-pixel 71 toward the first lateral side, and on the other hand, a visible angle of the blue sub-pixel 71 toward the second lateral side is less than a visible angle of the blue sub-pixel 71 toward the first lateral side. On the contrary, due to the shielding effect of the spacer 60, the light emitted by the red sub-pixel 72 toward the first lateral side is shielded to a greater extent. On the one hand, the brightness of the light emitted by the red sub-pixel 72 toward the first lateral side is less than the brightness of the light emitted by the red sub-pixel 72 toward the second lateral side, and on the other hand, a visible angle of the red sub-pixel 72 toward the first lateral side is less than the visible angle of the red sub-pixel 72 toward the second lateral side. Thus, upon the blue sub-pixel or the red sub-pixel being viewed from the first lateral side and the second lateral side at the same angle with respect to the normal of the display substrate, the brightness of the blue sub-pixel or the red sub-pixel viewed from the first lateral side is different from the brightness of the blue sub-pixel or the red sub-pixel viewed from the second lateral side, resulting in color shift when viewing a picture at different viewing angles, that is, the color viewed from the first lateral side is different from the color viewed from the second lateral side. In addition, due to the different distribution of spacers around the blue sub-pixel and the red sub-pixel, the brightness of the light emitted by the blue sub-pixel toward the second lateral side is less than the brightness of the light emitted by the blue sub-pixel toward the first lateral side, and the brightness of the light emitted by the red sub-pixel toward the first lateral side is less than the brightness of the light emitted by the red sub-pixel toward the second lateral side, thus further causing the display substrate to generate color shift when viewing a picture under different viewing angles.

With this regard, the embodiments of the present disclosure provide a display substrate and a display device. The display substrate includes a base substrate, a plurality of sub-pixel groups, first spacers, second spacers, and third spacers. The plurality of sub-pixel groups are arranged along a row direction and a column direction on the base substrate, and each of the plurality of sub-pixel groups includes a first sub-pixel, a second sub-pixel, and a third sub-pixel. In one row of sub-pixel groups, each of the first spacers is located between the first sub-pixel and the second sub-pixel which are adjacent to each other, each of the second spacers is located between the second sub-pixel and the third sub-pixel which are adjacent to each other, each of the third spacers is located between the third sub-pixel and the first sub-pixel which are adjacent to each other, and a number of the first spacers, a number of the second spacers and a number of the third spacers are approximately equal. Therefore, for one kind of sub-pixels in one row of sub-pixel groups (for example, the first sub-pixels, the second sub-pixels or the third sub-pixels), because the number of first spacers, the number of second spacers, and the number of third spacers are approximately equal, the number of spacers on the first lateral side and the number of spacers on the second lateral side of each kind of sub-pixels are also approximately the same, thereby improving the symmetry of spacers in one row of sub-pixel groups. In this way, upon one kind of sub-pixels being viewed from the first lateral side and the second lateral side at the same angle with respect to the normal of the display substrate, the brightness of this kind of sub-pixels in one row of plurality of sub-pixel groups viewed from the first lateral side and the second lateral side is approximately the same, thereby alleviating or even eliminating color shift when viewing a picture at different viewing angles. In addition, because the number of first spacers, the number of second spacers, and the number of third spacers are approximately equal, and the number of spacers around different sub-pixels in one row of sub-pixel groups is also approximately the same, the situations that different sub-pixels in one row of sub-pixel groups are blocked by spacers are also approximately the same, thus further alleviating and even eliminating color shift when viewing a picture under different viewing angles. Therefore, the display substrate can effectively alleviate, and even avoid the color shift phenomenon caused by uneven distribution of spacers.

Hereinafter, the display substrate and the display device provided by the embodiments of the present disclosure will be described with reference to the accompanying drawings.

Figure 3:
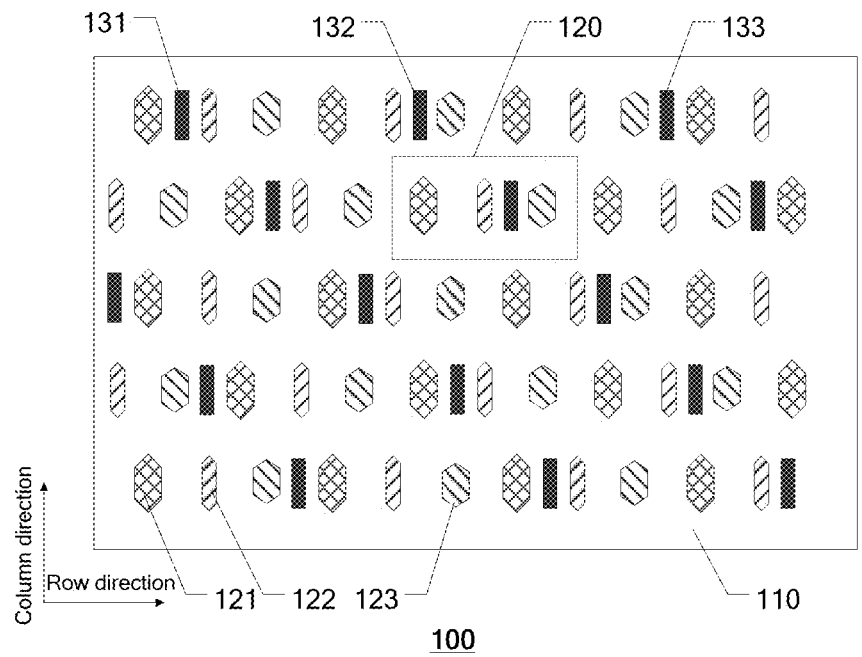
FIG. 3 is a schematic plan view of a display substrate according to an embodiment of the present disclosure.

FIG. 3 is a schematic plan view of a display substrate according to an embodiment of the present disclosure. As illustrated by FIG. 3, the display substrate 100 includes a base substrate 110, a plurality of sub-pixel groups 120, first spacers 131, second spacers 132, and third spacers 133. The plurality of sub-pixel groups 120 are disposed on the base substrate 110 and arranged in a row direction and a column direction, and each of the plurality of sub-pixel groups 120 includes a first sub-pixel 121, a second sub-pixel 122, and a third sub-pixel 123. In one row of sub-pixel groups 120, each of the first spacers 131 is located between the first sub-pixel 121 and the second sub-pixel 122 which are adjacent to each other, that is, each of the first spacers 131 is located in an interval region between the first sub-pixel 121 and the second sub-pixel 122 which are adjacent to each other; each of the second spacers 132 is located between the second sub-pixel 122 and the third sub-pixel 123 which are adjacent to each other, that is, each of the second spacers 132 is located in an interval region between the second sub-pixel 122 and the third sub-pixel 123 which are adjacent to each other; each of the third spacer 133 is located between the third sub-pixel 123 and the first sub-pixel 121 which are adjacent to each other, that is, each of the third spacers 133 is located in an interval region between the third sub-pixel 123 and the first sub-pixel 121 which are adjacent to each other. The number of first spacers 131, the number of second spacers 132, and the number of third spacers 133 are approximately equal. It should be noted that the first sub-pixel 121 shown in FIG. 3 may be an effective light emitting region of the first sub-pixel 121, the second sub-pixel 122 shown in FIG. 3 may be an effective light emitting region of the second sub-pixel 122, and the third sub-pixel 123 shown in FIG. 3 may be an effective light emitting region of the third sub-pixel 123. In addition, in the display field, a pixel usually includes a plurality of sub-pixels that can respectively display a single color (for example, red, green or blue). Different colors are displayed by controlling a proportion of sub-pixels of different colors, so the above-mentioned first sub-pixel can be a single color sub-pixel.

In the display substrate provided by the embodiment of the present disclosure, for one kind of sub-pixel (e.g., the first sub-pixel 121, the second sub-pixel 122, or the third sub-pixel 123) in one row of sub-pixel groups 120, because the number of first spacers 131, the number of second spacers 132, and the number of third spacers 133 are approximately equal, the number of spacers on the first lateral side and the number of spacers on the second lateral side of each kind of sub-pixels are also approximately the same. Therefore, the symmetry of the influence of spacers in one row of sub-pixel groups on the light emitting situation of sub-pixels is improved, so that upon one kind of sub-pixels being viewed from the first lateral side and the second lateral side at the same angle with respect to the normal of the display substrate, the brightness of the kind of sub-pixels in one row of sub-pixel groups viewed from the first lateral side and the second lateral side is approximately the same, thereby alleviating and even eliminating color shift when viewing a picture under different viewing angles. For example, supposing that the first lateral sides of 100 first sub-pixels 121 in one row of sub-pixel groups 120 are provided with the third spacers 133, and the second lateral sides of the 100 first sub-pixels 121 is provided with the first spacers 131, due to the shielding effect of the third spacers 133, the light emitted toward the first lateral side by 100 first sub-pixels 121 provided with the third spacers 133 will be shielded by the third spacers 133. Thus, the brightness of the light emitted toward the first lateral side by the 100 first sub-pixels 121 provided with the third spacers 133 at the first lateral side is smaller than the brightness of the light emitted toward the second lateral side. On the contrary, the brightness of the light emitted toward the second lateral side by the 100 first sub-pixels 121 provided with the first spacers 131 at the second lateral side is smaller than the brightness of the light emitted toward the first lateral side. Taking the first sub-pixels 121 in one row of plurality of sub-pixels 120 as a whole, the brightness of the light emitted by the first sub-pixels 121 toward the second lateral side is approximately equal to the brightness of the light emitted by the first sub-pixels 121 toward the first lateral side, thereby alleviating or even eliminating color shift when viewing a picture at different viewing angles. For example, in some examples, in one row of sub-pixel groups 120, the number of first spacers 131, the number of second spacers 132, and the number of third spacers 133 are equal, so that color shift when viewing a picture at different viewing angles can be better alleviated or even eliminated.

Figure 4:
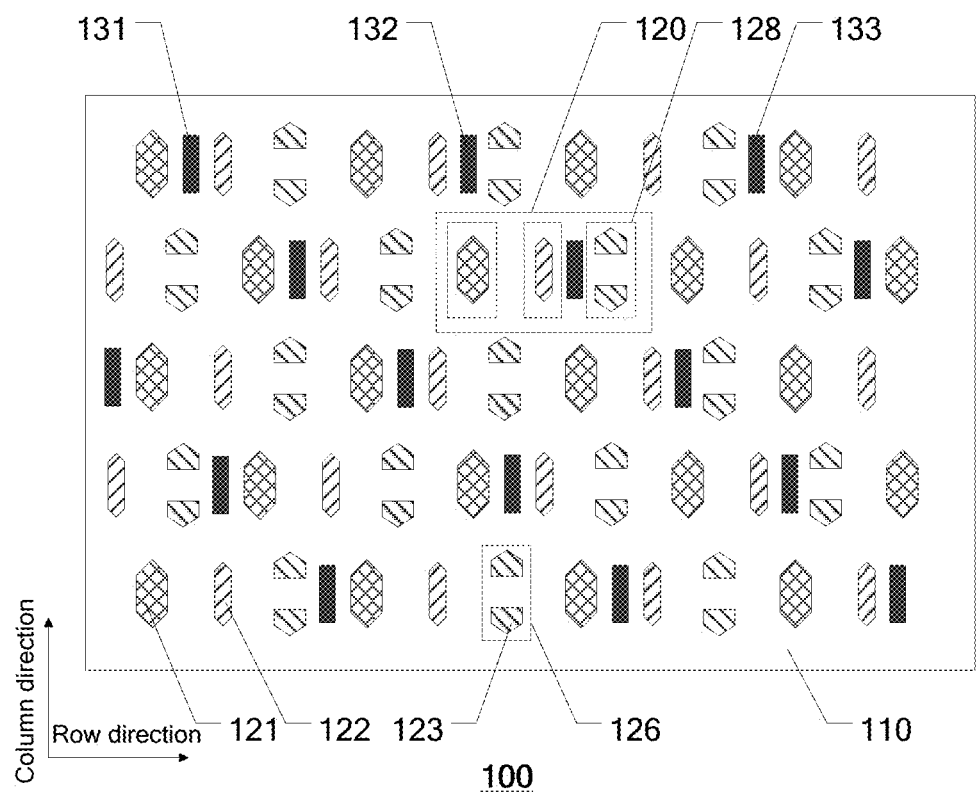
FIG. 4 is a schematic plan view of another display substrate according to an embodiment of the present disclosure.

FIG. 4 is a schematic plan view of a display substrate according to an embodiment of the present disclosure. As illustrated by FIG. 4, the display substrate 100 includes a base substrate 110, a plurality of sub-pixel groups 120, first spacers 131, second spacers 132, and third spacers 133. The plurality of sub-pixel groups 120 are disposed on the base substrate 110 and arranged in a row direction and a column direction, each of the plurality of sub-pixel groups 120 includes a first sub-pixel 121, a second sub-pixel 122 and a third sub-pixel pair 126, and the third sub-pixel pair 126 includes two third sub-pixels 123. In one row of sub-pixel groups 120, the first spacer 131 is located between the first sub-pixel 121 and the second sub-pixel 122 which are adjacent to each other, that is, the first spacer 131 is located in an interval region between the first sub-pixel 121 and the second sub-pixel 122; the second spacer 132 is located between the second sub-pixel 122 and the third sub-pixel pair 126 which are adjacent to each other, that is, the second spacer 132 is located in an interval region between the second sub-pixel 122 and the third sub-pixel pair 126 which are adjacent to each other; the third spacer 133 is located between the third sub-pixel pair 126 and the first sub-pixel 121 which are adjacent to each other, that is, the third spacer 133 is located in an interval region between the third sub-pixel pair 126 and the first sub-pixel 121 which are adjacent to each other. A number of first spacers 131, a number of second spacers 132, and a number of third spacers 133 are approximately equal. It should be noted that the first sub-pixel 121 shown in FIG. 4 may be an effective light emitting region of the first sub-pixel 121, the second sub-pixel 122 shown in FIG. 4 may be an effective light emitting region of the second sub-pixel 122, and the third sub-pixel 123 shown in FIG. 4 may be an effective light emitting region of the third sub-pixel 123. In addition, in the display field, a pixel usually includes a plurality of sub-pixels that can respectively display a single color (for example, red, green or blue). Different colors are displayed by controlling a proportion of sub-pixels of different colors, so the above-mentioned first sub-pixel can be a single color sub-pixel.

In the display substrate provided by the embodiment of the present disclosure, for one kind of sub-pixels (e.g., the first sub-pixel 121, the second sub-pixel 122, or the third sub-pixel 123) in one row of sub-pixel groups 120, because the number of first spacers 131, the number of second spacers 132, and the number of third spacers 133 are approximately equal, the number of spacers on the first lateral side and the number of spacers on the second lateral side of each kind of sub-pixels are also approximately the same. Therefore, the symmetry of the influence of spacers in one row of sub-pixel groups on the light emitting situation of sub-pixels is improved, in this way, upon one kind of sub-pixels being viewed from the first lateral side and the second lateral side at the same angle with respect to the normal of the display substrate, the brightness of this kind of sub-pixels in one row of sub-pixel groups viewed from the first lateral side and the second lateral side is approximately the same, thereby alleviating and even eliminating color shift when viewing a picture under different viewing angles. For example, supposing that the first lateral sides of 100 first sub-pixels 121 in one row of sub-pixel groups 120 are provided with the third spacers 133, and the second lateral sides of the 100 first sub-pixels 121 are provided with the first spacers 131, due to the shielding effect of the third spacers 133, the light emitted toward the first lateral side by 100 first sub-pixels 121 provided with the third spacers 133 will be shielded by the third spacers 133. Thus, the brightness of the light emitted toward the first lateral side by the 100 first sub-pixels 121 provided with the third spacer 133 at the first lateral side is smaller than the brightness of the light emitted toward the second lateral side. On the contrary, the brightness of the light emitted toward the second lateral side by the 100 first sub-pixels 121 provided with the first spacers 131 at the second lateral side is smaller than the brightness of the light emitted toward the first lateral side. Taking the first sub-pixels 121 in the row of sub-pixels 120 as a whole, the brightness of the light emitted by the first sub-pixels 121 toward the second lateral side is approximately equal to the brightness of the light rays emitted by the first sub-pixels 121 toward the first lateral side, thereby alleviating or even eliminating color shift when viewing a picture at different viewing angles.

In addition, in the display substrate provided by the embodiment of the present disclosure, for one kind of sub-pixels (for example, the first sub-pixel 121, the second sub-pixel 122, or the third sub-pixel 123) in one row of sub-pixel groups 120, because the number of first spacers 131, the number of second spacers 132, and the number of third spacers 133 are approximately equal, the numbers of spacers around different sub-pixels in one row of sub-pixel groups 120 are also approximately the same. Therefore, the situations that different sub-pixels in one row of sub-pixel groups 120 are blocked by spacers (e.g., the first spacer 131, the second spacer 132, and the third spacer 133) are also substantially the same, i.e., the situations that the first sub-pixel 121, the second sub-pixel 122, and the third sub-pixel 123 in one row of sub-pixel groups 120 are blocked by the spacers are also substantially the same, thereby further alleviating and even eliminating color shift when viewing a picture at different viewing angles. Therefore, the display substrate can effectively improve, and even avoid the color shift phenomenon caused by uneven distribution of spacers.

For example, the abovementioned expression that the number of the first spacers, the number of the second spacers and the number of the third spacers are approximately equal may refer to that ratios of the number of the first spacers, the number of the second spacers, and the number of the third spacers to an average value of the number of the first spacers, the number of the second spacers and the number of the third spacers respectively ranges from 0.9 to 1.1.

For example, the first spacers, the second spacers, and the third spacers can be made of polyimide. Of course, the embodiments of the present disclosure include but are not limited thereto. The first spacers, the second spacers, and the third spacers may also be made of silicone or other materials.

For example, the first spacers, the second spacers, and the third spacers can also be made of materials with relatively high light transmittance, thereby reducing the shielding effects of the first spacers, the second spacers, and the third spacers on light.

For example, in some examples, as illustrated by FIG. 4, in one row of sub-pixel groups 120, the first spacers 131, the second spacers 132, and the third spacers 133 are subsequently and repeatedly arranged. That is, in one row of sub-pixel groups 120, one first spacer 131, one second spacer 132, and one third spacer 133 are repeated as one group. Therefore, in a row of sub-pixel groups 120, the number of first spacers 131, the number of second spacers 132, and the number of third spacers 133 can be ensured to be approximately equal in a certain area, thus further alleviating and even eliminating color shift when viewing a picture at different viewing angles.

For example, one row of sub-pixel groups 120 is divided into N (N is a positive integer greater than or equal to 1) regions arranged in sequence, and each of the regions includes M (M is a positive integer greater than or equal to 1) the above-mentioned groups of the first spacer 131, the second spacer 132, and the third spacer 133; in this case, for each of the regions, the number of spacers on the first lateral side and the number of spacers on the second lateral side of each kind of sub-pixels are also approximately the same, thus improving the symmetry of the influence of spacers in the region on the light emitting situation of sub-pixels, so that upon one kind of the sub-pixels being viewed from the first lateral side and the second lateral side at the same angle with respect to the normal of the display substrate, the brightness of this kind of sub-pixels in the region observed from the first lateral side and the second lateral side is approximately the same, thereby further alleviating and even avoiding color shift phenomenon caused by uneven distribution of spacers. Similarly, for each of the regions, for one kind of sub-pixels in each of the regions, the numbers of spacers around different sub-pixels in each of the regions are approximately the same, so that the situations that different sub-pixels in each of regions are blocked by the spacers are also approximately the same, thus further alleviating and even eliminating color shift when viewing a picture under different viewing angles.

For example, in some examples, as illustrated by FIG. 4, each of the plurality of sub-pixel groups 120 includes at most one first spacer 131, one second spacer 132, or one third spacer 133, thereby reducing the density of the spacer and further managing the particle risk.

For example, in some examples, as illustrated by FIG. 4, in each of the plurality of sub-pixel groups 120, the first sub-pixel 121, the second sub-pixel 122, and the third sub-pixel pair 126 are arranged in the row direction and form three sub-pixel columns 128, and two third sub-pixels 123 in one third sub-pixel pair 126 are arranged in the column direction. That is, each of the plurality of sub-pixel groups 120 may include three sub-pixel columns 128. Therefore, the pixel arrangement structure of the display substrate can apply pixel borrowing technology, thus improving the resolution of the display substrate.

For example, in some examples, as illustrated by FIG. 4, in one row of sub-pixel groups 120, the first spacer 131 and the second spacer 132 are separated by 1+3n sub-pixel columns 128, the second spacer 132 and the third spacer 133 are separated by 1+3n sub-pixel columns 128, and the third spacer 133 and the first spacer 131 are separated by 1+3n sub-pixel columns 128, n is a positive integer greater than or equal to 1. For an OLED display substrate, the spacers have two functions: one is to support FMM for evaporation, and the other one is to support a cover plate during packaging. Thus, on the one hand, the display substrate provided by this example can ensure that the number of first spacers 131, the number of second spacers 132 and the number of third spacers 133 are approximately equal in one row of sub-pixel groups 120; on the other hand, upon the value of n being large, for example, upon n being greater than or equal to 2, the display substrate provided by this example can further reduce the density of spacers, thereby reducing particle risk when supporting FMM for vapor deposition and improving product yield. Of course, the value of n can be set according to the needs of supporting FMM and reducing the particle risk.

For example, in some examples, as illustrated by FIG. 4, two adjacent rows of the plurality of sub-pixel groups 120 are offset by ½ pitch, and the pitch is a distance between centers of two first sub-pixels 121 in the two adjacent sub-pixel groups 120 in the row direction. It should be noted that the pitch may also be a distance between the centers of the two second sub-pixels 122 or the third sub-pixel pair 126 in the two sub-pixel groups 120 adjacent in the row direction. The above center may be a geometric center of the sub-pixel. In addition, the two adjacent rows of sub-pixel groups 120 are offset by ½ pitch in the row direction. Of course, embodiments of the present disclosure include, but are not limited thereto, the two adjacent rows of the plurality of sub-pixel groups 120 are offset by other distance.

For example, in some examples, as illustrated by FIG. 4, the first sub-pixel 121 is configured to emit light of a first color, the second sub-pixel 122 is configured to emit light of a second color, and the third sub-pixel 123 is configured to emit light of a third color. It should be noted that, embodiments of the present disclosure include but are not limited thereto, one third sub-pixel of the third sub-pixel pair may be configured to emit light of a third color, while another third sub-pixel of the third sub-pixel pair may be configured to emit light of a fourth color.

For example, the first color is blue, the second color is red, and the third color is green. Therefore, the display substrate adopts a color scheme of red, green and blue; of course, the present disclosure includes but is not limited thereto, and the display substrate can also adopt other color schemes.

For example, in some examples, as illustrated by FIG. 4, the effective light emitting region of the first sub-pixel 121 has a substantially hexagonal or oval shape, and a long symmetry axis of the hexagonal shape or a long axis of the oval shape is substantially parallel to the column direction.

For example, in some examples, as illustrated by FIG. 4, the effective light emitting region of the second sub-pixel 122 also has a substantially hexagonal or oval shape, and a long symmetry axis of the hexagonal shape or a long axis of the oval shape is substantially parallel to the column direction.

For example, in some examples, as illustrated by FIG. 4, the effective light emitting region of the third sub-pixel 123 has a substantially pentagonal shape, and a right angle side of the pentagonal shape is substantially parallel to the row direction.

It should be noted that, the above-mentioned effective light emitting region is generally designed in a regular shape, such as the above-mentioned hexagonal, pentagonal, or oval shape. However, in the actual manufacturing process, the shape of the formed effective light emitting region will generally deviate from the regular shape designed above. For example, each corner of the above-mentioned regular shape may be rounded, so the shape of the effective light emitting region (e.g., the first effective light emitting region, the second effective light emitting region, or the third effective light emitting region) may be rounded. In addition, the shape of the effective light emitting region actually manufactured may also have other changes with the design shape. For example, the shape of an effective light emitting region designed as a hexagon may become approximately oval in actual manufacturing.

For example, in some examples, as illustrated by FIG. 4, the first spacer 131 has a substantially elongated shape, an extending direction of the first spacer 131 is substantially parallel to the column direction, the second spacer 132 has a substantially elongated shape, an extending direction of the second spacer 132 is substantially parallel to the column direction, the third spacer 133 has a substantially elongated shape, and an extending direction of the third spacer 133 is substantially parallel to the column direction. Therefore, the display substrate can make full use of the intervals or gaps between the sub-pixels because the sub-pixels are also generally long strips (hexagonal or oval). For example, the shape of the spacer (e.g., the first spacer, the second spacer, or the third spacer) is a shape of an orthographic projection of the spacer on the base substrate. Similarly, the shape of the effective light emitting region of the above-mentioned sub-pixel (e.g., the first sub-pixel, the second sub-pixel, or the third sub-pixel) is a shape of an orthographic projection of the sub-pixel on the base substrate.

For example, in the embodiment of the present disclosure, the elongated shape refers to that the length of elongated shape in one direction is greater than the length of elongated shape in another direction, or a size of the elongated shape in one direction is greater than the sizes in other directions. The elongated shape is not limited to a rectangle, and may be other shapes, for example, may be a long hexagonal shape, an oblong shape, a trapezoid shape, or other shapes.

For example, in some examples, as illustrated by FIG. 4, a size of the first spacer 131 in the column direction is smaller than a size of the first sub-pixel 121 in the column direction, sizes of the second spacer 132 and the third spacer 133 in the column direction are smaller than a size of the third sub-pixel pair 126 in the column direction, and a center of the first spacer 131, a center of the second spacer 132, a center of the third spacer 133, a center of the first sub-pixel 121, a center of the second sub-pixel 122, and a center of the third sub-pixel pair 126 are located on a line substantially parallel to the row direction.

For example, in some examples, as illustrated by FIG. 4, the first spacer 131, the second spacer 132, and the third spacer 133 have the same size, a width range of the first spacer 131 in the row direction is 6-15 microns, a length range of the first spacer 131 in the column direction is 35-45 microns, and a height range of the first spacer 131 in a direction perpendicular to both the row direction and the column direction is 1.5-2.5 microns. For example, a height of the first spacer 131 in a direction perpendicular to both the row direction and the column direction is 2 microns.

For example, in some examples, the effective light emitting region of the first sub-pixel 121 has a size range of 15-23 microns in the row direction and a size range of 35-45 microns in the column direction; the effective light emitting region of the second sub-pixel 122 has a size range of 11-21 microns in the row direction and a size range of 35-45 microns in the column direction; the effective light emitting area of the third sub-pixel 123 has a size range of 9-13 microns in the row direction and a size range of 9-13 microns in the column direction. In one third sub-pixel pair 116, the shortest distance between the two third sub-pixels 113 ranges from 13 to 15 microns.

Figure 5:
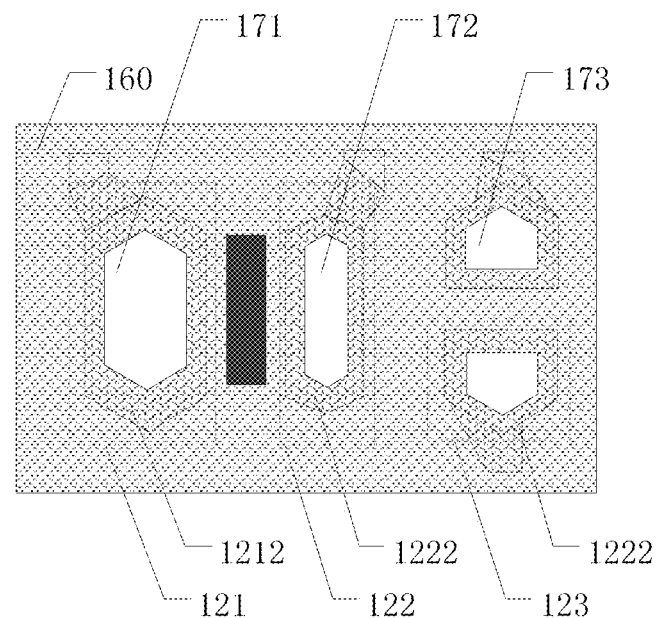
FIG. 5 is a schematic plan view of another display substrate according to an embodiment of the present disclosure.
Figure 6:
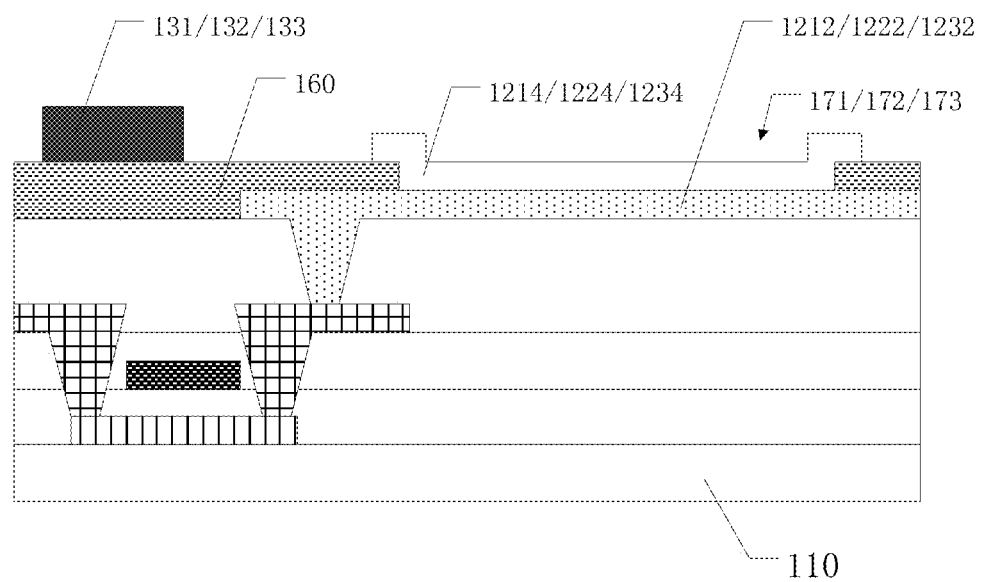
FIG. 6 is a schematic structural diagram of a sub-pixel in a display substrate according to an embodiment of the present disclosure.

FIG. 5 is a schematic plan view of another display substrate according to an embodiment of the present disclosure. FIG. 6 is a schematic structural diagram of a sub-pixel in a display substrate according to an embodiment of the present disclosure. In order to clearly show the structure of sub-pixel groups in the display substrate, FIG. 5 shows only one sub-pixel group. As illustrated by FIG. 6, in the sub-pixel group 120, the first sub-pixel 121 includes a first anode 1212 and a first light emitting functional layer 1214, the second sub-pixel 122 includes a second anode 1222 and a second light emitting functional layer 1224, and the third sub-pixel 123 includes a third anode 1232 and a third light emitting functional layer 1234. As illustrated by FIGS. 5 and 6, the display substrate further includes a pixel defining layer 160, located on a side of the first anode 1212, the second anode 1222, and the third anode 1232 away from the base substrate 110, the pixel defining layer 160 includes a first opening 171, a second opening 172, and a third opening 173, the first opening 171 exposes the first anode 1212, the second opening 172 exposes the second anode 1222, and the third opening 173 exposes the third anode 1232. At least a part of the first light emitting functional layer 1214 is located in the first opening 171 and covers an exposed portion of the first anode 1212, at least a part of the second light emitting functional layer 1224 is located in the second opening 172 and covers an exposed portion of the second anode 1222, at least a part of the third light emitting functional layer 1234 is located in the third opening 173 and covers an exposed portion of the third anode 1232, and the first spacer 131, the second spacer 132, and the third spacer 133 are located on a surface of the pixel defining layer 160 away from the base substrate 110. It should be noted that, the area of the first anode 1212 may be slightly larger than the area of the first light emitting functional layer 1214. In addition, the first light emitting functional layer 1214 may include an electroluminescent layer itself and other functional layers located on both sides of the electroluminescent layer, for example, a hole injection layer, a hole transport layer, an electron injection layer, an electron transport layer, and the like. The area of the second anode 1222 may be slightly larger than the area of the second light emitting functional layer 1224. In addition, the second light emitting functional layer 1224 may include an electroluminescent layer itself and other functional layers located on both sides of the electroluminescent layer, for example, a hole injection layer, a hole transport layer, an electron injection layer, an electron transport layer, and the like. The area of the third anode 1232 may be slightly larger than the area of the third light emitting functional layer 1234. In addition, the third light emitting functional layer 1234 may include an electroluminescent layer itself and other functional layers located on both sides of the electroluminescent layer, for example, a hole injection layer, a hole transport layer, an electron injection layer, an electron transport layer, and the like. For example, in some examples, orthographic projections of the first spacer 131, the second spacer 132, and the third spacer 133 on the base substrate 101 are not overlapped with orthographic projections of the first opening 171, the second opening 172, and the third opening 173 on the base substrate 101.

For example, in some examples, an orthographic projection of the first opening 171 on the base substrate 101 is completely located within an orthographic projection of the first anode 1212 on the base substrate 101; an orthographic projection of the second opening 172 on the base substrate 101 is completely located within an orthographic projection of the second anode 1222 on the base substrate 101; an orthographic projection of the third opening 173 on the base substrate 101 is completely located within the orthographic projection of the third anode 1232 on the base substrate 101.

For example, in some examples, an orthographic projection of the first opening 171 on the base substrate 101 is completely within an orthographic projection of the first light emitting functional layer 1214 on the base substrate 101; an orthographic projection of the second opening 172 on the base substrate 101 is completely located in an orthographic projection of the second light emitting functional layer 1224 on the base substrate 101; an orthographic projection of the third opening 173 on the base substrate 101 is completely located within an orthographic projection of the third light emitting functional layer 1234 on the substrate 101.

For example, in some examples, an edge of the orthographic projection of the first anode 1212 on the base substrate 101, an edge of the orthographic projection of the second anode 1222 on the base substrate 101, and an edge of the orthographic projection of the third anode 1232 on the base substrate 101 are covered by the orthographic projection of the pixel defining layer 160 on the base substrate 101.

For example, in some examples, the first light emitting functional layer 1214 may also partially cover the pixel defining layer 160, the second light emitting functional layer 1224 may also partially cover the pixel defining layer 160, and the third light emitting functional layer 1234 may also partially cover the pixel defining layer 160.

For example, in some examples, the first spacer 131, the second spacer 132, and the third spacer 133 are formed by a one-time mask process. For example, a spacer layer may be formed on a surface of the pixel defining layer 160 away from the base substrate 110, and then the spacer layer may be patterned by a patterning process to form the first spacer 131, the second spacer 132, and the third spacer 133.

For example, in some examples, the first spacer 131, the second spacer 132, the third spacer 133, and the pixel defining layer 160 are also formed by one mask process. For example, the first spacer 131, the second spacer 132, the third spacer 133, and the pixel defining layer 160 may be made of the same material. At least one embodiment of the present disclosure also provides a display device including the above-mentioned display substrate. Therefore, the display device can give consideration to the problems of spacer density and color shift improvement. On the one hand, the display device can alleviate or even eliminate color shift when viewing a picture under different viewing angles, and on the other hand, the display device can reduce spacer density, thereby controlling a particle risk and improving product yield. In a case where the display device adopts the display panel with the pixel arrangement structure provided by the embodiments of the disclosure, the resolution of the display device can be further improved, and further a display device with real high resolution can be provided. In addition, because the pixel arrangement structure provided by the embodiments of the present disclosure can have better symmetry, further, the uniformity of pixel distribution can be improved, and the display effect of the display device can be improved.

For example, in some examples, the display device may be any product or component with display function such as a smart phone, a tablet computer, a television, a display, a notebook computer, a digital photo frame, a navigator, etc.

Figure 7:
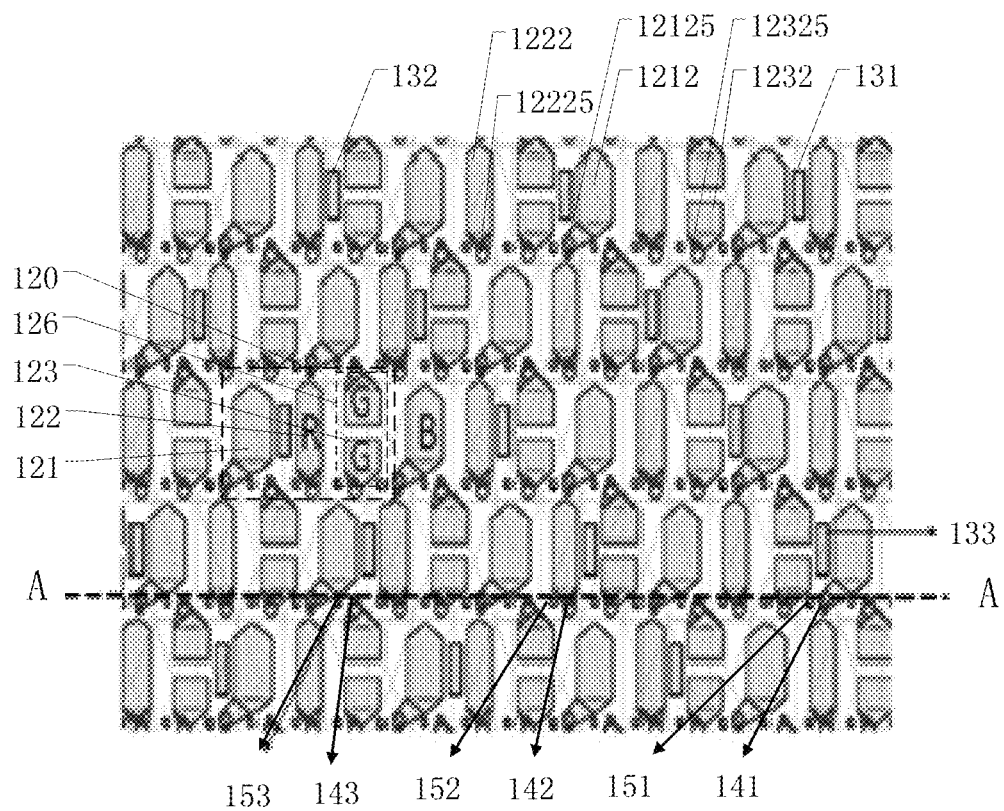
FIG. 7 is a schematic plan view of a display substrate according to an embodiment of the present disclosure.
Figure 8:
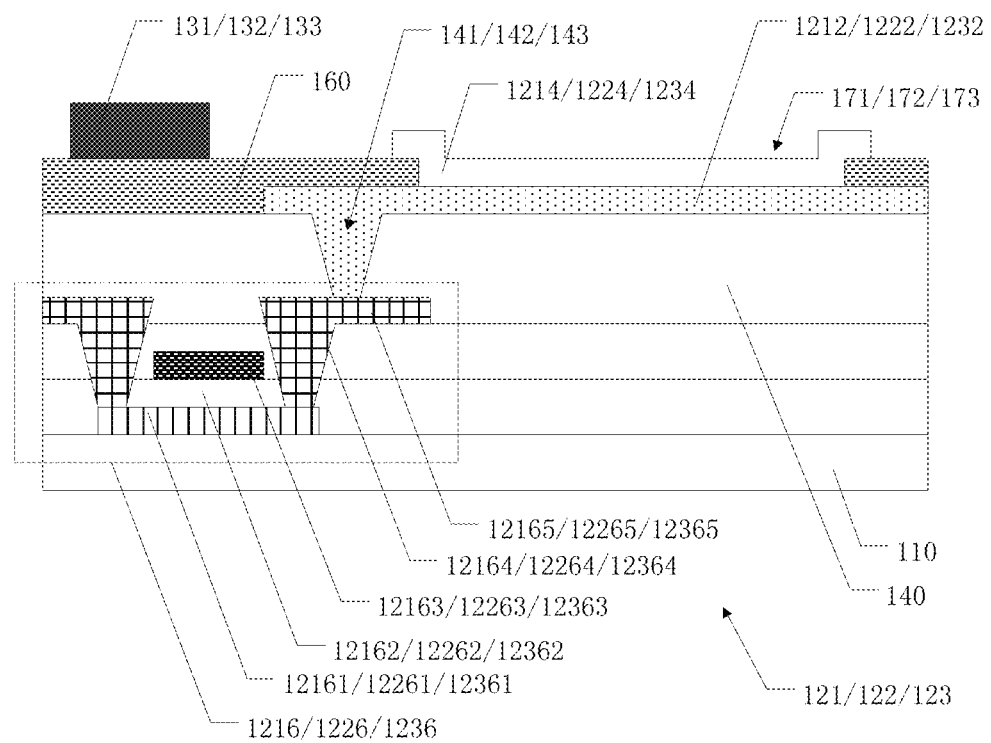
FIG. 8 is a schematic structural diagram of a sub-pixel in a display substrate according to an embodiment of the present disclosure.

An embodiment of the present disclosure provides a display substrate. FIG. 7 is a schematic plan view of a display substrate according to an embodiment of the present disclosure. FIG. 8 is a schematic structural diagram of a sub-pixel in a display substrate according to an embodiment of the present disclosure. As illustrated by FIG. 7, the display substrate includes a base substrate 110 and a plurality of sub-pixel groups 120. The plurality of sub-pixel groups 120 are disposed on the base substrate 110 and arranged in a row direction and a column direction, each of the plurality of sub-pixel groups 120 includes a first sub-pixel 121, a second sub-pixel 122 and a third sub-pixel pair 126, and the third sub-pixel pair 126 includes two third sub-pixels 123. FIG. 8 shows a schematic cross-sectional view of one sub-pixel along an AA direction in FIG. 7. As illustrated by FIG. 8, the first sub-pixel 121 includes a first anode 1212 and a first pixel driving circuit 1216, the second sub-pixel 122 includes a second anode 1222 and a second pixel driving circuit 1226, and the third sub-pixel 123 includes a third anode 1232 and a third pixel driving circuit 1236. The display substrate further includes a first planarization layer 140 located between the first anode 1212 and the first pixel driving circuit 1216, between the second anode 1222 and the second pixel driving circuit 1226, and between the third anode 1232 and the third pixel driving circuit 1236. The first sub-pixel 121 includes a first via hole 141 located in the first planarization layer 140, the second sub-pixel 122 includes a second via hole 142 located in the first planarization layer 140, and the third sub-pixel 123 includes a third via hole 143 located in the first planarization layer 140; the first via hole 141 is configured for connecting the first anode 1212 and the first pixel drive circuit 1216, the second via hole 142 is configured for connecting the second anode 1222 and the second pixel drive circuit 1226, and the third via hole 143 is configured for connecting the third anode 1232 and the third pixel drive circuit 1236. The first via hole 141, the second via hole 142, and a part of the third via hole 143 in one row of sub-pixel groups 120 are substantially on the same straight line. It should be noted that a portion of the first anode configured for connection can cover and fill a corresponding first via hole so as to be connected with the corresponding first pixel drive circuit. A portion of the second anode configured for connection can cover and fill a corresponding second via hole so as to be connected with the corresponding second pixel driving circuit; a portion of the third anode configured for connection may cover and fill a corresponding third via hole so as to be connected with the corresponding third pixel driving circuit.

In the display substrate provided by the embodiment of the present disclosure, because the first via hole 141, the second via hole 142, and a part of the third via hole 143 in one row of sub-pixel groups 120 are located substantially on the first straight line, that is, the first via hole 141, the second via hole 142, and a part of the third via hole 143 are arranged in a row with a pitch of one sub-pixel distance. Therefore, upon the process margin changing, the first via hole 141, the second via hole 142, and a part of the third via hole 143 can move up and down simultaneously, thereby facilitating the control of process deviation. For example, upon the process margin changing greatly, the first via hole 141, the second via hole 142, and a part of the third via hole 143 move up and down at the same time, either all of them are defective or none of them are defective, thus facilitating the control of process deviation. It should be noted that, upon defects occurring in the first via hole 141, the second via hole 142, and a part of the third via hole 143, these defects can be easily detected, so that the process can be adjusted in time.

For example, in some examples, as illustrated by FIG. 7, the first via holes 141 of the first sub-pixels 121, the second via holes 142 of the second sub-pixels 122, and the third via holes 143 of one third sub-pixels 123 in the third pixel pairs 126 in any two adjacent sub-pixel groups 120 in one row of sub-pixel groups 120 are located substantially on the same straight line. Therefore, upon the process margin changing, the first via holes 141, the second via holes 142, and the third via holes 143 can move up and down simultaneously, thereby facilitating control of process deviation.

For example, in some examples, as illustrated by FIG. 7, the above-mentioned first straight line is not overlapped with the effective light emitting regions of the sub-pixels (e.g., the first sub-pixel, the second sub-pixel and the third sub-pixel), that is, the above-mentioned first straight line is not located in an overlapping region of an organic layer and an anode of each sub-pixel.

For example, in some examples, as illustrated by FIG. 7, the above-mentioned first straight line is located between adjacent pixel group rows.

For example, in some examples, as illustrated by FIG. 7, the first straight line where the first via hole 141, the second via hole 142, and a part of the third via hole 143 in one row of sub-pixel groups 120 are located is substantially parallel to the row direction. For example, in some examples, as illustrated by FIG. 7, in each of the plurality of sub-pixel groups 120, the first sub-pixel 121, the second sub-pixel 122, and the third sub-pixel pair 126 are arranged in the row direction, the two third sub-pixels 123 in the third sub-pixel pair 126 are arranged in the column direction, and the two third via holes of the two three sub-pixels in the third sub-pixel pair are respectively located on two adjacent first straight lines. That is, one of the two third via holes 143 of the two third sub-pixels 123 arranged in the column direction in the third sub-pixel pair 126 is located in the same straight line as the first via hole 141 and the second via hole 142 in the sub-pixel group row (which can be referred to as the N-th sub-pixel group row) to which the third sub-pixel pair 126 belongs, while the other one of the two third via holes 143 of the two third sub-pixels 123 is located in the same straight line as the first via hole 141 and the second via hole 142 of the sub-pixel group row (which can be referred to as the (N−1)-th sub-pixel group row) adjacent to the sub-pixel group row to which the third sub-pixel pair 126 belongs.

For example, in some examples, as illustrated by FIG. 8, the first pixel driving circuit 1216 may include a first active layer 12161, a first gate insulating layer 12162, a first gate electrode 12163, a first interlayer insulating layer 12164, and a first source and drain electrode layer 12165; the second pixel driving circuit 1226 may include a second active layer 12261, a second gate insulating layer 12262, a second gate electrode 12263, a second interlayer insulating layer 12264, and a second source and drain electrode layer 12265; the third pixel driving circuit 1236 may include a third active layer 12361, a third gate insulating layer 12362, a third gate electrode 12363, a third interlayer insulating layer 12364, and a third source drain electrode layer 12365.

For example, a source electrode and a drain electrode in the first source-drain electrode layer 12165 are respectively connected to a source region and a drain region of the first active layer 12161 through via holes in the first gate insulating layer 12162 and the first interlayer insulating layer 12164; an orthographic projection of the first gate electrode 12163 on the base substrate 101 is overlapped with an orthographic projection of a channel region of the first active layer 12161 on the base substrate 101. The source electrode and the drain electrode in the second source and drain electrode layer 12265 are respectively connected to a source region and a drain region of the second active layer 12261 through via holes in the second gate insulating layer 12262 and the second interlayer insulating layer 12264; the orthographic projection of the second gate electrode 12263 on the base substrate 101 is overlapped with the orthographic projection of a channel region of the second active layer 12261 on the base substrate 101. The source electrode and the drain electrode in the third source-drain electrode layer 12365 are respectively connected to a source region and a drain region of the third active layer 12361 through via holes in the third gate insulating layer 12362 and the third interlayer insulating layer 12364; an orthographic projection of the third gate electrode 12363 on the base substrate 101 is overlapped with an orthographic projection of a channel region of the third active layer 12361 on the base substrate 101. For example, in some examples, the first active layer 12161, the second active layer 12261, and the third active layer 12361 may be manufactured by the same semiconductor layer; for example, the first active layer 12161, the second active layer 12261, and the third active layer 12361 may be made of polysilicon, monocrystalline silicon, oxide semiconductor, or the like.

For example, in some examples, the first gate insulating layer 12162, the second gate insulating layer 12262, and the third gate insulating layer 12362 are the same gate insulating layer. For example, the first gate insulating layer 12162, the second gate insulating layer 12262, and the third gate insulating layer 12362 may be made of insulating materials such as silicon nitride, silicon oxide, and silicon oxynitride.

For example, in some examples, the first gate electrode 12163, the second gate electrode 12263, and the third gate electrode 12363 may be manufactured by the same conductive layer. For example, the first gate electrode 12163, the second gate electrode 12263, and the third gate electrode 12363 may be made of conductive materials such as molybdenum, titanium, aluminum, and copper.

For example, in some examples, the first interlayer insulating layer 12164, the second interlayer insulating layer 12264, and the third interlayer insulating layer 12364 are the same interlayer insulating layer; the first interlayer insulating layer 12164, the second interlayer insulating layer 12264, and the third interlayer insulating layer 12364 may be made of insulating materials such as silicon nitride, silicon oxide, and silicon oxynitride.

For example, in some examples, the first source-drain electrode layer 12165, the second source-drain electrode layer 12265, and the third source-drain electrode layer 12365 may be made of the same conductive layer; for example, the first source-drain electrode layer 12165, the second source-drain electrode layer 12265, and the third source-drain electrode layer 12365 may be made of aluminum, titanium, copper, molybdenum, or the like.

Figure 9:
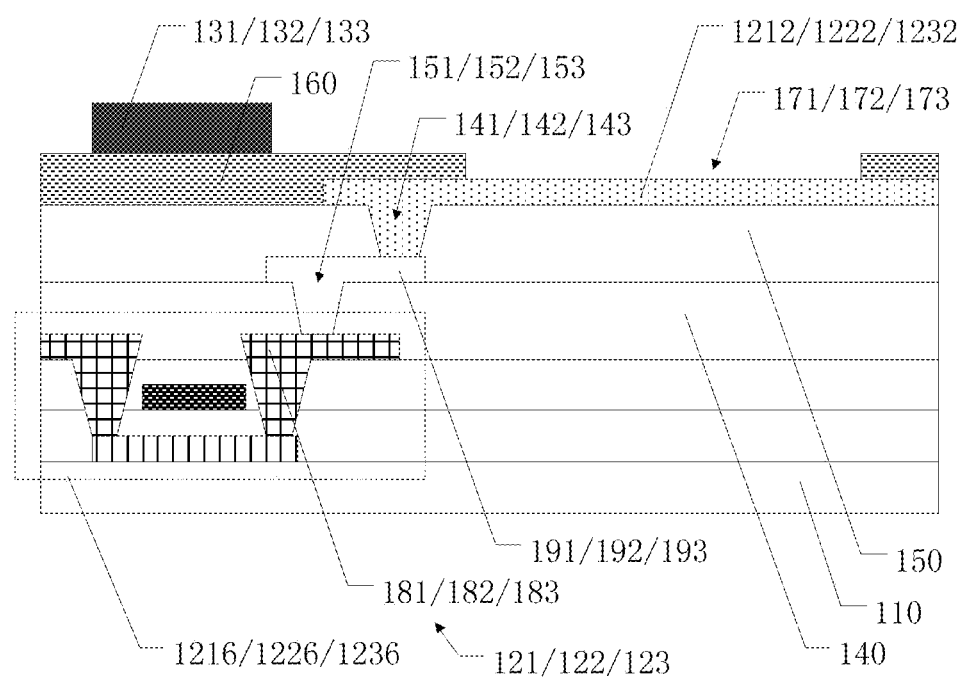
FIG. 9 is a schematic structural diagram of a sub-pixel in another display substrate according to an embodiment of the present disclosure.

FIG. 9 is a schematic structural diagram of sub-pixels in another display substrate according to an embodiment of the present disclosure. As illustrated by FIG. 9, the display substrate further includes a second planarization layer 150 located between the first planarization layer 140 and the first pixel driving circuit 1216, the second pixel driving electrode 1226, and the third pixel driving circuit 1236, wherein the first pixel driving circuit 1216 includes a first electrode 181, the second pixel driving circuit 1226 includes a second electrode 182, and the third pixel driving circuit 1236 includes a third electrode 183; the display substrate further includes a first connection electrode 191, a second connection electrode 192, and a third connection electrode 193 located between the second planarization layer 150 and the first planarization layer 140, the first sub-pixel 121 further includes a fourth via hole 151 located in the second planarization layer 150, the second sub-pixel 122 further includes a fifth via hole 152 located in the second planarization layer 150, The third sub-pixel 123 further includes a sixth via hole 153 located in the second planarization layer 150, the fourth via hole 151 is configured for connecting the first electrode 181 and the first connection electrode 191, the fifth via hole 152 is configured for connecting the second electrode 182 and the second connection electrode 192, the sixth via hole 153 is configured for connecting the third electrode 183 and the third connection electrode 193, and the fourth via hole 151, the fifth via hole 152, and a part of the sixth via hole 153 in one row of sub-pixel groups 120 are located substantially on the second straight line. It should be noted that the first electrode, the second electrode, and the third electrode may be drain electrodes in the source-drain electrode layer in the corresponding pixel drive circuit.

In the display substrate provided by the embodiment of the present disclosure, because the fourth via hole 151, the fifth via hole 152, and a part of the sixth via hole 153 in one row of sub-pixel groups 120 are located substantially on the second straight line, that is, the fourth via hole 151, the fifth via hole 152, and a part of the sixth via hole 153 are arranged in a row, and spaced apart with one sub-pixel distance. Therefore, upon the process margin changing, the fourth via hole 151, the fifth via hole 152, and a part of the sixth via hole 153 can move up and down simultaneously, thereby facilitating control of process deviation. For example, upon the process margin changing greatly, the fourth via hole 151, the fifth via hole 152, and the sixth via hole 153 move up and down simultaneously, either all of which are defective or none of which are defective, thus facilitating the control of process deviation. It should be noted that upon defects occurring in the fourth via hole 151, the fifth via hole 152, and the sixth via hole 153, these defects are easily detected, so that the process can be adjusted in time.

For example, in some examples, as illustrated by FIG. 7, the fourth via hole 151 of the first sub-pixel 121, the fifth via hole 152 of the second sub-pixel 122, and the sixth via hole 153 of the third sub-pixel 123 of the third sub-pixel pair 126 in any two adjacent sub-pixel groups 120 in one row of sub-pixel groups 120 are located substantially on the second straight line. Therefore, upon the process margin changing, the fourth via hole 151, the fifth via hole 152, and the sixth via hole 153 can move up and down simultaneously, thereby facilitating control of process deviation.

For example, in some examples, as illustrated by FIG. 7, two sixth via holes 153 of two third sub-pixels 123 in the third sub-pixel pair 126 are respectively located on two adjacent second straight lines. That is, one of the two sixth via holes 153 of the two third sub-pixels 123 arranged in the column direction in the third sub-pixel pair 126 is located in the same straight line as the fourth via hole 151 and the fifth via hole 152 in the sub-pixel group row (which can be referred to as the N-th sub-pixel group row) to which the third sub-pixel pair 126 belongs, while the other one of the two sixth via holes 153 of the two third sub-pixels 123 is located in the same straight line as the fourth via hole 151 and the fifth via hole 152 of the sub-pixel group row (which can be referred to as the (N−1)-th sub-pixel group row) adjacent to the sub-pixel group row to which the third sub-pixel pair 126 belongs.

For example, in some examples, as illustrated by FIG. 7, the first straight line and the second straight line in one row of sub-pixel groups 120 are approximately coincident, for example, the same straight line. That is, the first via hole 141, the second via hole 142, a part of the third via hole 143, the fourth via hole 151, the fifth via hole 152, and a part of the sixth via hole 153 in one row of sub-pixel groups 120 are substantially on the same straight line. Therefore, upon the process margin changing, the first via hole 141, the second via hole 142, a part of the third via hole 143, the fourth via hole 151, the fifth via hole 152, and a part of the sixth via hole 153 can move up and down at the same time, thereby facilitating control of process deviation. For example, upon the process margin changing greatly, the first via hole 141, the second via hole 142, the partial third via hole 143, the fourth via hole 151, the fifth via hole 152, and the partial sixth via hole 153 move up and down at the same time, either all of which are defective or none of which are defective, thus facilitating the control of process deviation. It should be noted that upon defects occurring in the first via hole 141, the second via hole 142, a part of the third via hole 143, the fourth via hole 151, the fifth via hole 152, and part of the sixth via hole 153, these defects are easily detected, so that the process can be adjusted in time.

For example, in some examples, as illustrated by FIG. 7, the first via hole 141 and the fourth via hole 151 of the first sub-pixel 121 in any two adjacent sub-pixel groups 120 in one row of sub-pixel groups 120, the second via hole 142 and the fifth via hole 152 of the second sub-pixel 122, and the third via hole 143 and the sixth via hole 153 of the third sub-pixel 123 in the third sub-pixel pair 126 are substantially on the same straight line. Therefore, upon the process margin changing, the first via hole 141, the second via hole 142, the third via hole 143, the fourth via hole 151, the fifth via hole 152, and the sixth via hole 153 can move up and down at the same time, thereby facilitating control of process deviation.

For example, in some examples, as illustrated by FIG. 7, orthographic projections of the first via hole 141, the second via hole 142, the third via hole 143, the fourth via hole 151, the fifth via hole 152, and the sixth via hole 153 in a row of sub-pixel groups 120 are not overlapped with each other on the base substrate 110.

For example, in some examples, as illustrated by FIG. 7, the first via hole 141, the second via hole 142, and the third via hole 143 in one row of sub-pixel groups 120 are equally spaced.

For example, in some examples, as illustrated by FIG. 7, the fourth via hole 151, the fifth via hole 152, and the sixth via hole 153 in a row of sub-pixel groups 120 are equally spaced.

For example, in some examples, a distance between the fourth via hole 151 and the first via hole 141, a distance between the fifth via hole 152 and the second via hole 142, and a distance between the sixth via hole 153 and the third via hole 143 are approximately equal. It should be noted that the distance between the fourth via hole 151 and the first via hole 141 refers to the shortest distance between the fourth via hole 151 and the first via hole 141 in the same first sub-pixel. Similarly, the distance between the fifth via hole 152 and the second via hole 142 refers to the shortest distance between the fifth via hole 152 and the second via hole 142 in the same second sub-pixel, and the distance between the sixth via hole 153 and the third via hole 143 refers to the shortest distance between the sixth via hole 153 and the third via hole 143 in the same third sub-pixel. For example, in some examples, the distance between the first via hole 141 and the fourth via hole 151 is smaller than the distance between the first via hole 141 and the second via hole 142, the distance between the second via hole 142 and the fifth via hole 152 is smaller than the distance between the second via hole 142 and the third via hole 143, and the distance between the third via hole 143 and the sixth via hole 153 is smaller than the distance between the second via hole 142 and the third via hole 143.

For example, in some examples, as illustrated by FIG. 7, the arrangement of the first sub-pixel 121, the second sub-pixel 122, and the third sub-pixel 123 in each of the plurality of sub-pixel groups 120 can be seen in the pixel arrangement structure in the display substrate shown in FIG. 3, that is, the first sub-pixel 121, the second sub-pixel 122, and the third sub-pixel pair 126 are arranged in the row direction, and the two third sub-pixels 123 are arranged in the column direction.

For example, in some examples, as illustrated by FIG. 7, the first via hole 141, the second via hole 142, and the third via hole 143 in one row of sub-pixel groups 120 are located between two adjacent rows of the plurality of sub-pixel groups 120.

For example, in some examples, as illustrated by FIG. 7, in each of the plurality of sub-pixel groups 120, a first sub-pixel 121, a second sub-pixel 122, and a third sub-pixel pair including two third sub-pixels 123 are arranged in the row direction, and two third sub-pixels 123 in the third sub-pixel pair are arranged in the column direction. In this pixel arrangement, the third via hole 143 and the sixth via hole 153 located on the same straight line need to provide electrical connection for the anode and the pixel driving circuit in the third sub-pixel in the two rows of pixel groups adjacent to the straight line. In this case, the fourth via hole 151, the first via hole 141, the sixth via hole 153, the third via hole 143, the fifth via hole 152, the second via hole 142, the sixth via hole 153, and the third via hole 143 are cyclically arranged in sequence.

For example, in some examples, in a case where the first sub-pixel 121 is a blue sub-pixel, the second sub-pixel 122 is a red sub-pixel, and the third sub-pixel 123 is a green sub-pixel, the fourth via hole 151, the first via hole 141, the sixth via hole 153, the third via hole 143, the fifth via hole 152, the second via hole 142, the sixth via hole 153, and the third via hole 143 are subsequently and repeatedly arranged; in this case, the fourth via hole 151 and the first via hole 141 provide electrical connection for the pixel drive circuit and the anode of the blue sub-pixel of the first row, the fifth via hole 152 and the second via hole 142 provide electrical connection for the pixel drive circuit and the anode of the red sub-pixel of the first row, the sixth via hole 153 of the first set and the third via hole 143 provide electrical connection for the pixel drive circuit and the anode of the green sub-pixel of the second row, and the sixth via hole 153 of the second set and the third via hole 143 provide electrical connection for the pixel drive circuit and the anode of the green sub-pixel of the first row.

For example, in some examples, as illustrated by FIG. 7, a distance between the fourth via hole 151 and the first via hole 141 is smaller than a distance between the first via hole 141 and the second via hole 142; a distance between the fifth via hole 152 and the second via hole 142 is smaller than a distance between the first via hole 141 and the second via hole 142; a distance between the sixth via hole 153 and the third via hole 142 is smaller than a distance between the first via hole 141 and the second via hole 142. For example, in some examples, the first anode 1212 further includes a first connection electrode block 12125 located on a side of the first anode 1212 away from the second sub-pixel 122 in the row direction, and electrically connected to the first pixel driving electrode 1216 through the first via hole 141; the second anode 1222 further includes a second connection electrode block 12225 electrically connected to the second pixel drive electrode 1226 through the second via hole 142, and the third anode 1232 further includes a second connection electrode block 12325 electrically connected to the third pixel drive electrode 1236 through the third via hole 143.

For example, in some examples, as illustrated by FIG. 7, the first via hole 141 and the fourth via hole 151 are located on a side of the main body portion of the first anode 1212 (a portion overlapping with the first effective light emitting region) away from the main body portion of the adjacent second anode 1222 (a portion overlapping with the second effective light emitting region), and the fourth via hole 151 is located on a side of the first via hole 141 away from the main body portion of the adjacent first anode 1212.

For example, in some examples, as illustrated by FIG. 7, the second via hole 142 is located directly below the main body portion of the second anode 1222, that is, an orthographic projection of the second via hole 132 in the row direction is overlapped with an orthographic projection of the main body portion of the second anode 1222 in the row direction. The fifth via hole 152 is located on a side of the second via hole 142 away from the adjacent third sub-pixel pair 126.

For example, in some examples, as illustrated by FIG. 7, the two third via holes 143 of the third sub-pixel pair 126 are respectively located on two adjacent first straight lines, and the two third via holes 143 are respectively located on the upper and lower sides of the third sub-pixel pair 126, that is, orthographic projections of the two third via holes 143 in the row direction are overlapped with the orthographic projection of the third sub-pixel pair 126 in the row direction. The sixth via hole 153 is located on a side of the corresponding third via hole 143 away from the adjacent first sub-pixel 121.

An embodiment of the present disclosure also provides a display device. The display device includes the display substrate. Because the first via hole 141, the second via hole 142, and the third via hole 143 in one row of sub-pixel groups 120 are located on substantially the same straight line, that is, the first via hole 141, the second via hole 142, and the third via hole 143 are arranged in a row, and spaced apart with one sub-pixel distance. Therefore, upon the process margin changing, it is convenient to control the process deviation. Upon the display device adopting the display panel with the pixel arrangement structure provided by the embodiment of the disclosure, the resolution of the display device can be further improved, and a display device with real high resolution can be further provided. In addition, because the pixel arrangement structure provided by the embodiment of the present disclosure can have better symmetry, further, the uniformity of pixel distribution can be improved, and the display effect of the display device can be improved. For example, in some examples, the display device may be any product or component with display function such as a smart phone, a tablet computer, a television, a display, a notebook computer, a digital photo frame, a navigator, etc.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The invention claimed is:

1. A display substrate, comprising:
    a base substrate;
    a plurality of sub-pixel groups, arranged on the base substrate along a row direction and a column direction; and
    first spacers, second spacers, and third spacers,
    wherein each of the plurality of sub-pixel groups comprises a first sub-pixel, a second sub-pixel, and a third sub-pixel,
    in one row of sub-pixel groups, each of the first spacers is located between the first sub-pixel and the second sub-pixel which are adjacent to each other, each of the second spacers is located between the second sub-pixel and the third sub-pixel which are adjacent to each other, the third spacer is located between the third sub-pixel and the first sub-pixel which are adjacent to each other, and a number of the first spacers, a number of the second spacers, and a number of the third spacers are approximately equal to one another;
    in one row of sub-pixel groups, one first sub-pixel, one second sub-pixel, one third sub-pixel pair and one fourth sub-pixel are arranged between every two adjacent spacers among the first, second and third spacers, wherein the fourth sub-pixel is one of the first sub-pixel, the second sub-pixel and the third sub-pixel pair.

2. The display substrate according to claim 1, wherein, in one row of sub-pixel groups, the first spacers, the second spacers, and the third spacers are subsequently and repeatedly arranged.

3. The display substrate according to claim 1, wherein each of the plurality of sub-pixel groups comprises at most one first spacer, one second spacer, or one third spacer.

4. The display substrate according to claim 1, wherein each of the plurality of sub-pixel groups comprises one first sub-pixel, one second sub-pixel, and one third sub-pixel pair, the third sub-pixel pair comprises two third sub-pixels,
    in one row of sub-pixel groups, each of the first spacers is located between the first sub-pixel and the second sub-pixel which are adjacent to each other, each of the second spacers is located between the second sub-pixel and the third sub-pixel pair which are adjacent to each other, and each of the third spacers is located between the third sub-pixel pair and the first sub-pixel which are adjacent to each other.

5. The display substrate according to claim 4, wherein, in each of the plurality of sub-pixel groups, the first sub-pixel, the second sub-pixel, and the third sub-pixel pair are arranged along the row direction and form three sub-pixel columns, and the two third sub-pixels in the third sub-pixel pair are arranged along the column direction.

6. The display substrate according to claim 4, wherein two adjacent rows of sub-pixel groups are offset by ½ pitch, and the pitch is a distance between centers of the two first sub-pixels of two adjacent ones of the plurality of sub-pixel groups in the row direction.

7. The display substrate according to claim 1, wherein the first sub-pixel is configured to emit light of a first color, the second sub-pixel is configured to emit light of a second color, and the third sub-pixel is configured to emit light of a third color.

8. The display substrate according to claim 4, wherein each of the first spacers has a substantially elongated shape, an extending direction of each of the first spacers is substantially parallel to the column direction, each of the second spacers has a substantially elongated shape, an extending direction of each of the second spacers is substantially parallel to the column direction, each of the third spacers has a substantially elongated shape, and an extending direction of each of the third spacers is substantially parallel to the column direction.

9. The display substrate according to claim 8, wherein a size of each of the first spacers in the column direction is smaller than a size of the first sub-pixel in the column direction, a size of each of the second spacers and a size of each of the third spacers in the column direction are both smaller than a size of the third sub-pixel pair in the column direction,
    a center of each of the first spacers, a center of each of the second spacers, a center of each of the third spacers, a center of the first sub-pixel, a center of the second sub-pixel, and a center of the third sub-pixel pair are located on a straight line substantially parallel to the row direction.

10. The display substrate according to claim 1, wherein each of the first spacers, each of the second spacers, and each of the third spacers have the same size, a width of each of the first spacers in the row direction has a range of 6-15 microns, a length of each of the first spacers in the column direction has a range of 35-45 microns, and a height of each of the first spacers in a direction perpendicular to the base substrate has a range of 1.5-2.5 microns.

11. The display substrate according to claim 1, wherein the first sub-pixel comprises a first anode and a first light emitting functional layer, the second sub-pixel comprises a second anode and a second light emitting functional layer, the third sub-pixel comprises a third anode and a third light emitting functional layer, and the display substrate further comprises:
    a pixel defining layer, located on a side of the first anode, the second anode, and the third anode away from the base substrate, and including a first opening, a second opening, and a third opening, the first opening exposing the first anode, the second opening exposing the second anode, and the third opening exposing the third anode,
    wherein at least a part of the first light-emitting functional layer is located in the first opening and covers an exposed portion of the first anode, at least a part of the second light-emitting functional layer is located in the second opening and covers an exposed portion of the second anode, at least a part of the third light-emitting functional layer is located in the third opening and covers an exposed portion of the third anode, and the first spacers, the second spacers, and the third spacers are located on a surface of the pixel defining layer away from the base substrate, wherein orthographic projections of the first spacers, the second spacers, and the third spacers on the base substrate are not overlapped with orthographic projections of the first opening, the second opening, and the third opening on the base substrate.

12. A display device, comprising a display substrate, the display substrate comprising:

a base substrate;

a plurality of sub-pixel groups, arranged on the base substrate along a row direction and a column direction; and first spacers, second spacers, and third spacers, wherein each of the plurality of sub-pixel groups comprises a first sub-pixel, a second sub-pixel, and a third sub-pixel, in one row of sub-pixel groups, each of the first spacers is located between the first sub-pixel and the second sub-pixel which are adjacent to each other, each of the second spacers is located between the second sub-pixel and the third sub-pixel which are adjacent to each other, the third spacer is located between the third sub-pixel and the first sub-pixel which are adjacent to each other, and a number of the first spacers, a number of the second spacers, and a number of the third spacers are approximately equal to one another;

in one row of sub-pixel groups, one first sub-pixel, one second sub-pixel, one third sub-pixel pair and one fourth sub-pixel are arranged between every two adjacent spacers among the first, second and third spacers, wherein the fourth sub-pixel is one of the first sub-pixel, the second sub-pixel and the third sub-pixel pair.

* * * * *